US012586759B2

(12) United States Patent
Luu et al.

(10) Patent No.: US 12,586,759 B2
(45) Date of Patent: Mar. 24, 2026

(54) PULSED RF PLASMA GENERATOR WITH HIGH DYNAMIC RANGE

(71) Applicant: MKS Inc., Andover, MA (US)

(72) Inventors: Ky Luu, Victor, NY (US); Jonathan Smyka, Rochester, NY (US); Aaron Radomski, Conesus, NY (US)

(73) Assignee: MKS Inc., Andover, MA (US)

( * ) Notice: Subject to any disclaimer, the term of this patent is extended or adjusted under 35 U.S.C. 154(b) by 88 days.

(21) Appl. No.: 18/390,694

(22) Filed: Dec. 20, 2023

(65) Prior Publication Data

US 2024/0258071 A1 Aug. 1, 2024

Related U.S. Application Data

(60) Provisional application No. 63/441,616, filed on Jan. 27, 2023.

(51) Int. Cl.
*H01J 37/32* (2006.01)

(52) U.S. Cl.
CPC .. *H01J 37/32146* (2013.01); *H01J 37/32183* (2013.01); *H01J 2237/3343* (2013.01)

(58) Field of Classification Search
None
See application file for complete search history.

(56) References Cited

U.S. PATENT DOCUMENTS 4,403,197 A 9/1983 Swanson
6,201,208 B1 3/2001 Wendt et al.

| | | |
|---|---|---|
| 7,602,127 B2 | 10/2009 | Coumou |
| 7,719,377 B2 | 5/2010 | Luu et al. |
| 8,110,991 B2 | 2/2012 | Coumou |
| 8,395,322 B2 | 3/2013 | Coumou |
| 8,488,349 B2 | 7/2013 | Hou |
| 9,208,992 B2 | 12/2015 | Brouk et al. |
| 9,210,790 B2 | 12/2015 | Hoffman et al. |
| 9,214,909 B2 | 12/2015 | Radomski et al. |

(Continued)

FOREIGN PATENT DOCUMENTS

| CN | 111886671 A | 11/2020 |
|---|---|---|
| EP | 2351070 B1 | 5/2022 |

(Continued)

OTHER PUBLICATIONS

International Search Report and Written Opinion of the ISA issued in PCT/US2024/010731, mailed May 9, 2024; ISA/US.

(Continued)

*Primary Examiner* — Alexander H Taningco
(74) *Attorney, Agent, or Firm* — Kurt Eaton

(57) ABSTRACT

A RF power generator having a fixed power generation section. The fixed power generation section includes a first plurality of power amplifiers each configured to receive a supply voltage and to output a respective first voltage. The RF power generator also includes a weighted power generation section including a plurality of weighted power amplifier modules. Each weighted power amplifier module includes a weighted power amplifier and an associated transformer. Each weighted power amplifier of the weighted power amplifier module receives a respective weighted supply voltage. The voltage across the transformer of each weighted power amplifier module is a fraction of the first voltage.

33 Claims, 11 Drawing Sheets

(56)                References Cited

U.S. PATENT DOCUMENTS

| | | |
|---|---|---|
| 9,287,086 B2 | 3/2016 | Brouk et al. |
| 9,287,092 B2 | 3/2016 | Brouk et al. |
| 9,435,029 B2 | 9/2016 | Brouk et al. |
| 9,704,690 B2 | 7/2017 | Kim et al. |
| 9,748,864 B2 | 8/2017 | Luu |
| 9,852,889 B1 | 12/2017 | Kellogg et al. |
| 10,049,857 B2 | 8/2018 | Fisk, II et al. |
| 10,283,330 B2 | 5/2019 | Marakhtanov et al. |
| 10,354,839 B2 | 7/2019 | Alt et al. |
| 10,396,601 B2 | 8/2019 | Luu et al. |
| 10,474,184 B2 | 11/2019 | Kim et al. |
| 10,546,724 B2 | 1/2020 | Radomski et al. |
| 10,607,813 B2 | 3/2020 | Fairbairn et al. |
| 10,741,363 B1 | 8/2020 | Burry et al. |
| 10,821,542 B2 | 11/2020 | Nelson et al. |
| 10,985,740 B2 | 4/2021 | Prager et al. |
| 11,011,940 B2 | 5/2021 | Luu et al. |
| 11,282,677 B2 | 3/2022 | Shaw et al. |
| 11,284,500 B2 | 3/2022 | Dorf et al. |
| 11,437,221 B2 | 9/2022 | Carter et al. |
| 11,462,389 B2 | 10/2022 | Dorf et al. |
| 11,527,384 B2 | 12/2022 | Burry et al. |
| 11,551,908 B2 | 1/2023 | Ziemba et al. |
| 2012/0319584 A1 | 12/2012 | Brouk et al. |
| 2015/0332894 A1 | 11/2015 | Valcore, Jr. et al. |
| 2019/0006155 A1 | 1/2019 | Zhao et al. |
| 2019/0180982 A1 | 6/2019 | Brouk et al. |
| 2019/0304752 A1 | 10/2019 | Kim |
| 2020/0328070 A1* | 10/2020 | Schoessow ........... H01J 49/022 |
| 2021/0021236 A1* | 1/2021 | Surakitbovorn .......... H03F 1/56 |
| 2021/0327679 A1 | 10/2021 | Carter et al. |
| 2021/0384877 A1* | 12/2021 | Hardy ...................... H03F 3/19 |
| 2022/0037120 A1 | 2/2022 | Dorf et al. |
| 2022/0037123 A1* | 2/2022 | Zhang ............... H01J 37/32174 |
| 2022/0216838 A1 | 7/2022 | Gruner et al. |
| 2024/0404788 A1* | 12/2024 | Luu ................... H01J 37/32146 |

FOREIGN PATENT DOCUMENTS

| | | |
|---|---|---|
| JP | 2016184924 A | 10/2016 |
| KR | 1020200010035 A | 1/2020 |
| KR | 102143178 B1 | 8/2020 |
| KR | 102280293 B1 | 7/2021 |
| KR | 1020220038492 A | 3/2022 |
| KR | 1020230036115 A | 3/2023 |
| TW | 202113907 A | 4/2021 |
| TW | 202213940 A | 4/2022 |
| WO | WO-2022103544 A1 | 5/2022 |
| WO | WO-2022173626 A1 | 8/2022 |

OTHER PUBLICATIONS

1 Taiwan Office Action regarding Patent Application No. 113103051, dated Mar. 20, 2025.

* cited by examiner

PULSED RF PLASMA GENERATOR WITH HIGH DYNAMIC RANGE

CROSS-REFERENCE TO RELATED APPLICATIONS

This application claims benefit of U.S. Provisional Application No. 63/441,616, filed on Jan. 27, 2023. The entire disclosure of the above application is incorporated herein by reference.

FIELD

The present disclosure relates to RF generator systems and to control of RF generators.

BACKGROUND

Plasma processing is frequently used in semiconductor fabrication. In plasma processing, ions are accelerated by an electric field to etch material from or deposit material onto a surface of a substrate. In one basic implementation, the electric field is generated based on Radio Frequency (RF) or Direct Current (DC) power signals generated by a respective RF or DC generator of a power delivery system. The power signals generated by the generator must be precisely controlled to effectively execute plasma etching.

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions. One general aspect includes a RF power generator. The RF power generator also includes a fixed power generation section including a first plurality of power amplifiers each configured to receive a supply voltage and to output a first voltage. The generator also includes a weighted power generation section including a plurality of weighted power amplifier modules, each weighted power amplifier module including a weighted power amplifier and a transformer, where each weighted power amplifier of the plurality of weighted power amplifier modules receives a respective weighted supply voltage, and a voltage across the transformer of each weighted power amplifier module is a fraction of the first voltage. Other embodiments of this aspect include corresponding computer systems, apparatus, and computer programs recorded on one or more computer storage devices, each configured to perform the actions of the methods.

Implementations may include one or more of the following features. The RF power generator where at least one of the plurality of weighted power amplifiers of the plurality of weighted power amplifier modules receives a fraction of the supply voltage and the at least one of the plurality of weighted power amplifier modules is configured to output a voltage that is a fraction of the first voltage. The at least one of the plurality of weighted power amplifier modules is configured to output a different fraction of the first voltage from an other of the plurality of weighted power amplifier modules. More than one of the plurality of weighted power amplifier modules receives a same fraction of the supply voltage. A transformer associated with one of the more than one of the plurality of weighted power amplifier modules has a different turns ratio than an other of the more than one of the plurality of weighted power amplifier modules. At least one of the plurality of weighted power amplifier modules receives the supply voltage and the at least one of the plurality of weighted power amplifier modules is configured to output a voltage that is a fraction of the first voltage. A transformer associated with at least one of the plurality of weighted power amplifier modules has a different turns ratio so that the at least one of the plurality of weighted power amplifier modules outputs a voltage that is a fraction of the first voltage. More than one of the plurality of weighted power amplifier modules receives the supply voltage and the more than one of the plurality of weighted power amplifier modules is configured to output a voltage that is a fraction of the first voltage. A transformer associated with more than one of the plurality of weighted power amplifier modules has a different turns ratio than an other of the more than one of the plurality of weighted power amplifier modules. The weighted supply voltage is input to a weighted power amplifier of the plurality of weighted power amplifier modules. Each weighted supply voltage is input to a respective weighted power amplifier of the plurality of weighted power amplifier modules. The weighted supply voltage is a binary fraction of the supply voltage. The RF power generator may include a harmonic filter configured to transform an impedance of each power amplifier to an inductive impedance. The inductive impedance is located above a horizontal axis of a smith chart. The first plurality of power amplifiers of the fixed power generation section are connected in series. The each of the first plurality of power amplifiers of the fixed power generation section is configured to output the respective first voltage to a respective transformer, and the respective transformers are connected in series. The weighted power amplifier modules of the weighted power generation section are connected in series. Each of the plurality of weighted power amplifier modules of the weighted power generation section is configured to output the fraction of the first voltage to respective associated transformers, and the respective associated transformers are connected in series. Each power amplifier of the fixed power generation section and each power amplifier module of the weighted power generation section are connected in series, and the fixed power generation section and the weighted power generation section are connected in series. Less than all of the first plurality of power amplifiers of the fixed power generation section generate a voltage output at one time, and the first plurality of power amplifiers rotate between generating an output voltage and being turned off. The fraction of the first voltage is a binary fraction of the first voltage. Implementations of the described techniques may include hardware, a method or process, or computer software on a computer-accessible medium.

A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions. One general aspect includes a RF power generator. The RF power generator also includes a fixed power generation section including a first plurality of power amplifiers each configured to receive a supply voltage and to output a first voltage. The generator also includes a weighted power generation section including a plurality of weighted power amplifier modules, each weighted power amplifier module is configured to receive a respective weighted supply voltage, and a voltage across the output of each weighted power amplifier module is a fraction of the first voltage. Other embodiments of this aspect include corresponding computer systems, apparatus, and computer programs recorded on one or more computer storage devices, each configured to perform the actions of the methods.

Implementations may include one or more of the following features. The RF power generator where at least one of the plurality of weighted power amplifiers of the plurality of weighted power amplifier modules receives a fraction of the supply voltage and the at least one of the plurality of weighted power amplifier modules is configured to output a voltage that is a fraction of the first voltage. At least one of the plurality of weighted power amplifier modules receives the supply voltage and the at least one of the plurality of weighted power amplifier modules is configured to output a voltage that is a fraction of the first voltage. The weighted supply voltage is input to a weighted power amplifier of the plurality of weighted power amplifier modules. The weighted supply voltage is a binary fraction of the supply voltage. The RF power generator may include a harmonic filter configured to transform an impedance of each power amplifier to an inductive impedance. The first plurality of power amplifiers of the fixed power generation section is connected in series. The each of the first plurality of power amplifiers of the fixed power generation section is configured to output the respective first voltage to a respective transformer, and the respective transformers are connected in series. The weighted power amplifier modules of the weighted power generation section are connected in series. Each of the plurality of weighted power amplifier modules of the weighted power generation section is configured to output the fraction of the first voltage to respective transformers, and the respective associated transformers are connected in series. Each power amplifier of the fixed power generation section and each power amplifier module of the weighted power generation section are connected in series, and the fixed power generation section and the weighted power generation section are connected in series. Less than all of the first plurality of power amplifiers of the fixed power generation section generates a voltage output at one time, and the first plurality of power amplifiers rotate between generating an output voltage and being turned off. Implementations of the described techniques may include hardware, a method or process, or computer software on a computer-accessible medium.

One general aspect includes a non-transitory computer-readable medium storing instructions. The non-transitory computer-readable medium storing instructions also includes receiving a commanded output voltage. The instructions also includes determining a number of power amplifiers of a plurality of power amplifiers that when activated will generate the commanded output voltage. The instructions also includes generating a control word in accordance with the number of power amplifiers and controlling the number of power amplifiers in accordance with the control word to generate an output voltage. Other embodiments of this aspect include corresponding computer systems, apparatus, and computer programs recorded on one or more computer storage devices, each configured to perform the actions of the methods.

Implementations may include one or more of the following features. The non-transitory computer-readable medium the instructions may include comparing the output voltage with the commanded output voltage and adjusting the number of power amplifiers in accordance with a difference between the output voltage with the commanded output voltage. The plurality of power amplifiers includes a first plurality of power amplifier configured to receive a supply voltage and to output a first voltage and a second plurality of power weighted power amplifiers configured to receive a respective weighted supply voltage and output a fraction of the first voltage. Implementations of the described techniques may include hardware, a method or process, or computer software on a computer-accessible medium.

Further areas of applicability of the present disclosure will become apparent from the detailed description, the claims, and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings.

In the drawings, reference numbers may be reused to identify similar and/or identical elements.

DETAILED DESCRIPTION

Figure 1:
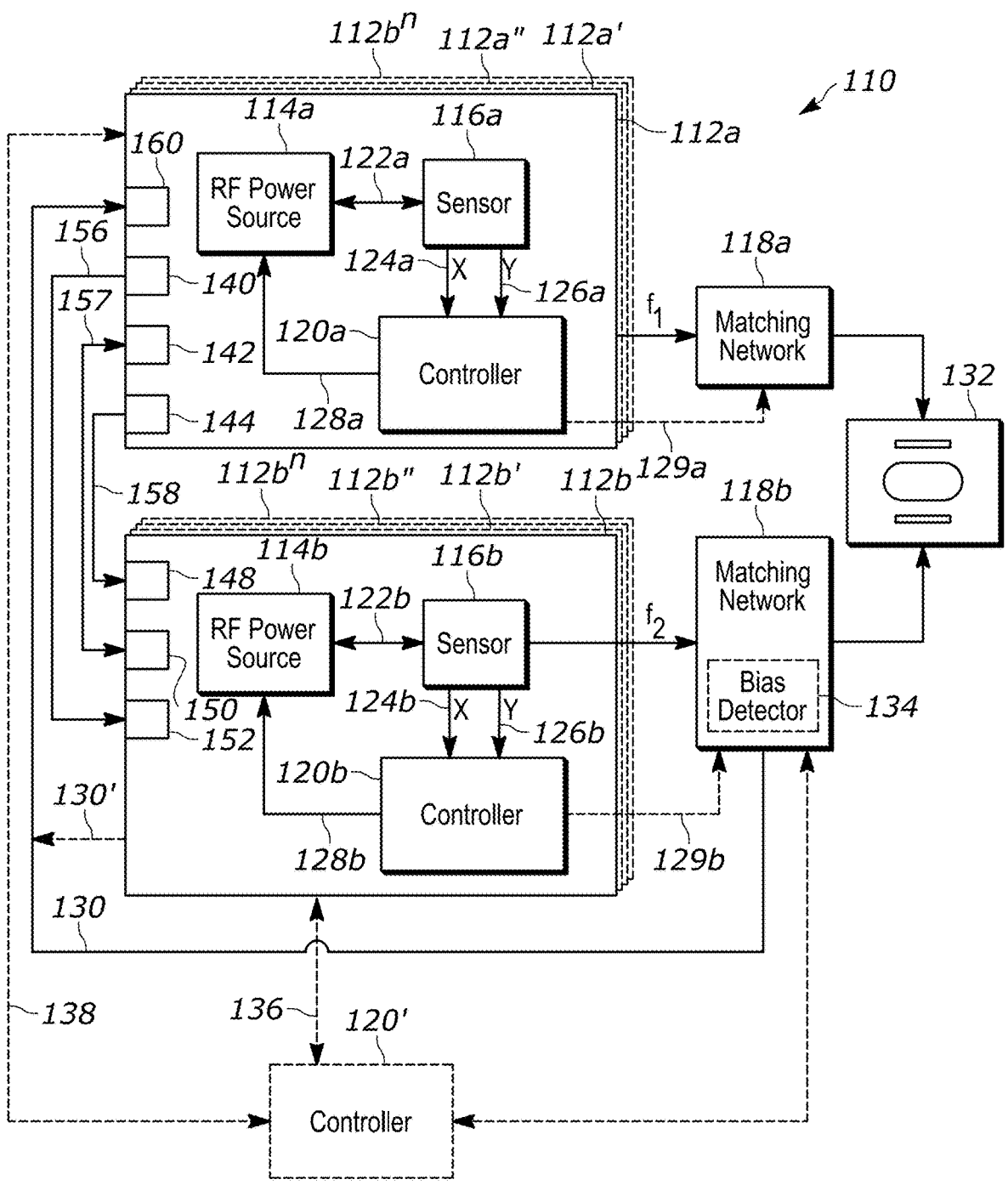
FIG. 1 is a schematic block diagram of a power delivery system having multiple power supplies arranged according to various configurations of the present disclosure.

A power system may include a DC or RF power generator or DC or RF generator, a matching network, and a load (such as a process chamber, a plasma chamber, or a reactor having a fixed or variable impedance). The power generator generates a DC or RF power signal, which is received by the matching network or impedance optimizing controller or circuit. The matching network or impedance optimizing controller or circuit transforms a load impedance to a characteristic impedance of a transmission line between the power generator and the matching network. The impedance matching aids in maximizing an amount of power forwarded to the load ("forward power") and minimizing an amount of power reflected back from the load to the power generator ("reverse power" or "reflected power"). Delivered power to the load may be maximized by minimizing reflected power when the input impedance of the matching network matches the characteristic impedance of the transmission line and generator.

In the power source or power supply field, there are typically two approaches to applying a power signal to the load. A first, more traditional approach is to apply a continuous power signal to the load. In a continuous mode or continuous wave mode, a continuous power signal is typically a constant DC or sinusoidal RF power signal that is output continuously by the power source to the load. In the continuous mode approach, the power signal assumes a constant DC or sinusoidal output, and the amplitude of the power signal and/or frequency (of a RF power signal) can be varied in order to vary the output power applied to the load.

A second approach to applying the power signal to the load involves pulsing a RF signal, rather than applying a continuous RF signal to the load. In a pulse or pulsed mode of operation, a RF signal is modulated by a modulation signal in order to define an envelope for the modulated power signal. The RF signal may be, for example, a sinusoidal RF signal or other time varying signal. Power delivered to the load is typically varied by varying the modulation signal.

In a typical power supply configuration, output power applied to the load is determined by using sensors that measure the forward and reflected power or the voltage and current of the RF signal applied to the load. Either set of these signals is analyzed in a control loop. The analysis typically determines a power value which is used to adjust the output of the power supply in order to vary the power applied to the load. In a power delivery system where the load is a process chamber or other non-linear or time varying load, the varying impedance of the load causes a corresponding varying of power applied to the load, as applied power is in part a function of the impedance of the load.

In systems where fabrication of various devices relies upon introduction of power to a load to control a fabrication process, power is typically delivered in one of two configurations. In a first configuration, the power is capacitively coupled to the load. Such systems are referred to as capacitively coupled plasma (CCP) systems. In a second configuration, the power is inductively coupled to the load. Such systems are typically referred to as inductively coupled plasma (ICP) systems. Power coupling to the plasma can also be achieved via wave coupling at microwave frequencies. Such an approach typically uses Electron Cyclotron Resonance (ECR) or microwave sources. Helicon sources are another form of wave coupled sources and typically operate at RF frequencies similar to that of conventional ICP and CCP systems. Power delivery systems may include at least one bias power and/or a source power applied to one or a plurality of electrodes of the load. The source power typically generates a plasma and controls plasma density, and the bias power modulates ions in the formulation of the sheath. The bias and the source may share the same electrode or may use separate electrodes, in accordance with various design considerations.

When a power delivery system drives a time-varying or non-linear load, such as a process chamber or plasma chamber, the power absorbed by the bulk plasma and plasma sheath results in a density of ions with a range of ion energy. One characteristic measure of ion energy is the ion energy distribution function (IEDF). The ion energy distribution function (IEDF) can be controlled with the bias power. One way of controlling the IEDF for a system in which multiple RF power signals are applied to the load occurs by varying multiple RF signals that are related by at least one of amplitude, frequency, and phase. The related at least one of amplitude, frequency, and phase of multiple RF power signals may also be related by a Fourier series and the associated coefficients. The frequencies between the multiple RF power signals may be locked, and the relative phase between the multiple RF signals may also be locked. Examples of such systems can be found with reference to U.S. Pat. Nos. 7,602,127; 8,110,991; and 8,395,322, all assigned to the assignee of the present application and incorporated by reference in this application.

Time varying or non-linear loads may be present in various applications. In one application, plasma processing systems may also include components for plasma generation and control. One such component is a non-linear load implemented as a process chamber, such as a plasma chamber or reactor. A typical plasma chamber or reactor utilized in plasma processing systems, such as by way of example, for thin-film manufacturing, can utilize a dual power system. One power generator (the source) controls the generation of the plasma, and the other power generator (the bias) controls ion energy. Examples of dual power systems include systems that are described in U.S. Pat. Nos. 7,602,127; 8,110, 991; and 8,395,322, referenced above. The dual power system described in the above-referenced patents employs a closed-loop control system to adapt power supply operation for the purpose of controlling ion density and its corresponding ion energy distribution function (IEDF).

Multiple approaches exist for controlling a process chamber, such as may be used for generating plasmas. For example, in RF power delivery systems, phase and frequency of multiple driving RF signals operating at the same or nearly the same frequency may be used to control plasma generation. For RF driven plasma sources, the periodic waveform affecting plasma sheath dynamics and the corresponding ion energy are generally known and are controlled by the frequency of the periodic waveforms and the associated phase interaction. Another approach in RF power delivery systems involves dual frequency control. That is, two RF frequency sources operating at different frequencies are used to power a plasma chamber to provide substantially independent control of ion and electron densities.

Another approach utilizes wideband RF power sources to drive a plasma chamber. A wideband approach presents certain challenges. One challenge is coupling the power to the electrode. A second challenge is that the transfer function of the generated waveform to the actual sheath voltage for a desired IEDF must be formulated for a wide process space to support material surface interaction. In one responsive approach in an inductively coupled plasma system, controlling power applied to a source electrode controls the plasma density while controlling power applied to the bias electrode modulates ions to control the IEDF to provide etch rate and etch feature profile control. By using source electrode and bias electrode control, the etch rate and other various etch characteristics are controlled via the ion density and energy.

As integrated circuit and device fabrication continues to evolve, so do the power requirements for controlling the process for fabrication. For example, with memory device fabrication, the requirements for bias power continue to increase. Increased power generates higher and more energetic ions for increased directionality or anisotropic etch feature profiles and faster surface interaction, thereby increasing the etch rate and allowing higher aspect ratio features to be etched. In RF systems, increased ion energy is sometimes accompanied by a lower bias frequency requirement along with an increase in the power and number of bias power sources coupled to the plasma sheath created in the plasma chamber. The increased power at a lower bias frequency and the increased number of bias power sources results in intermodulation distortion (IMD) from a sheath modulation. The IMD emissions can significantly reduce power delivered by the source where plasma generation occurs. U.S. Pat. No. 10,821,542, issued Nov. 3, 2020, entitled Pulse Synchronization by Monitoring Power in Another Frequency Band, assigned to the assignee of the present application, and incorporated by reference herein, describes a method of pulse synchronization by monitoring power in another frequency band. In the referenced U.S. patent application, the pulsing of a second RF generator is controlled in accordance with detecting at the second RF generator the pulsing of a first RF generator, thereby synchronizing pulsing between the two RF generators.

The manufacture of modern high performance memory devices, such as non-volatile flash memory in which the memory cells are stacked vertically in multiple layers (3D NAND flash) and dynamic random-access memory (DRAM), requires precise etching of extremely high aspect ratio (HAR) features, of the order of great than 50:1 height-to-width ratios. A RF bias generator operating in a pulsed mode, as will be described in greater detail below, is a key component to meeting the challenging requirements of a semiconductor processing system used for HAR etching. Pulsing of the bias RF generator enables alternating between high energy ion-assisted etching of the memory structure and low energy polymer formation to protect the HAR feature sidewalls.

Present RF bias generators provide multi-level pulsing with power ranges of 200 W to approximately 50 kW at pulse widths near 100 microseconds. Emerging device fabrication processes, however, require wider power ranges (on the order of 50 W to >200 kW) and narrower pulse widths, of less than approximately 25 microseconds. Existing RF bias generator designs typically control power using pulse width modulated (PWM) or outphasing (Chireix) power amplifier drive schemes. These drive schemes limit the available dynamic range to approximately 20 dB and minimum pulse widths of approximately 20 RF cycles. Further, conventional PWM and Chireix drive schemes are highly inefficient when RF generators are operated to meet the requirements of HAR fabrication, which include generating pulse waveforms at low duty cycles, such as less than approximately 5% of the pulse period, and low power for greater than approximately 95% of the pulse period. Further yet, floorspace in typical wafer fabrication facilities is expensive, while increasing bias power requirements have caused an increase in wafer fabrication facility space requirements. Thus, there is a need for RF generators that output higher power over an improved dynamic range and having improved power densities. With particular respect to RF bias generators, the evolving requirements of wafer fabrication call for RF bias generators that meet these capabilities.

FIG. 1 depicts a RF generator or power supply system 110. Power supply system 110 includes a pair of radio frequency (RF) generators or power supplies 112a, 112b, matching networks 118a, 118b, and load 132, such as a non-linear load, which may be a plasma chamber, plasma reactor, process chamber, and the like. In various configurations, RF generator 112a is referred to as a source RF generator or power supply, and matching network 118a is referred to as a source matching network. Also in various configurations, RF generator 112b is referred to as a bias RF generator or power supply, and matching network 118b is referred to as a bias matching network. It will be understood that components can be referenced individually or collectively using the reference number with or without a letter subscript or a prime symbol. In various configurations, one or both of matching networks 118a, 118b may be implemented as a RF blocking filter, rather than an impedance match, such as may be the case for a matching network receiving a pulsed DC or non-sinusoidal signal. In various other configurations, one or both of matching networks 118a, 118b may be omitted.

In various configurations, source RF generator 112a receives a control signal 130 from matching network 118b, generator 112b, or a control signal 130' from bias RF generator 112b. Control signals 130 or 130' represent an input signal to source RF generator 112a that indicates one or more operating characteristics or parameters of bias RF generator 112b. In various configurations, a synchronization bias detector 134 senses the RF signal output from matching network 118b to load 132 and outputs synchronization or trigger signal 130 to source RF generator 112a. In various configurations, synchronization or trigger signal 130' may be output from bias RF generator 112b to source RF generator 112a, rather than trigger signal 130. A difference between trigger or synchronization signals 130, 130' may result from the effect of matching network 118b, which can adjust the phase between the input signal to and output signal from matching network. Signals 130, 130' include information about the operation of bias RF generator 112b that in various configurations enables predictive responsiveness to address periodic fluctuations in the impedance of plasma chamber or load 132 caused by the bias RF generator 112b. When control signals 130 or 130' are absent, RF generators 112a, 112b operate autonomously.

RF generators 112a, 112b include respective RF power sources or amplifiers 114a, 114b, sensors 116a, 116b, and processors, controllers, or control modules 120a, 120b. RF power sources 114a, 114b generate respective RF power signals 122a, 122b output to respective sensors 116a, 116b. RF power signals 122a, 122b pass through sensors 116a, 116b and are provided to matching networks 118a, 118b as respective RF power signals $f_1$ and $f_2$. Sensors 116a, 116b output signals that vary in accordance with various parameters sensed from load 132. While sensors 116a, 116b, are shown within respective RF generators 112a, 112b, sensors 116a, 116b can be located externally to RF generators 112a, 112b. Such external sensing can occur at the output of the RF generator, at the input of an impedance matching device located between the RF generator and the load, or between the output of the impedance matching device (including within the impedance matching device) and the load.

Sensors 116a, 116b detect various operating parameters and output signals X and Y. Sensors 116a, 116b may include voltage, current, and/or directional coupler sensors. Sensors 116a, 116b may detect (i) voltage V and current I and/or (ii) forward power $P_{FWD}$ output from respective power amplifiers 114a, 114b and/or RF generators 112a, 112b and reverse or reflected power PREV received from respective matching networks 118a, 118b or load 132 connected to respective sensors 116a, 116b. The voltage V, current I, forward power $P_{FWD}$, and reverse power PREV may be scaled, filtered, or scaled and filtered versions of the actual voltage, current, forward power, and reverse power associated with the respective power sources 114a, 114b. Sensors 116a, 116b may be analog or digital sensors or a combination thereof. In a digital implementation, the sensors 116a, 116b may include analog-to-digital (A/D) converters and signal sampling components with corresponding sampling rates. Signals X and Y can represent any of the voltage V and current I or forward (or source) power $P_{FWD}$ reverse (or reflected) power PREV.

Sensors 116a, 116b generate sensor signals X, Y, which are received by respective controllers or control modules 120a, 120b. Control modules 120a, 120b process the respective X, Y signals 124a, 126a and 124b, 126b and generate one or a plurality of feedforward or feedback control signals 128a, 128b to respective power sources 114a, 114b. Power sources 114a, 114b adjust RF power signals 122a, 122b based on the received one or plurality feedback or feedforward control signal. In various configurations, power control modules 120a, 120b may control matching networks 118a, 118b, respectively, via respective control signals 129a, 129b based on, for example, X, Y signals 124a, 126a and 124b, 126b. Power control modules 120a, 120b may include one or more proportional-integral (PI), proportional-integral-derivative (PID), linear-quadratic-regulator (LQR) controllers or subsets thereof and/or direct digital synthesis (DDS) component(s) and/or any of the various components described below in connection with the modules.

In various configurations, power control modules 120a, 120b may include functions, processes, processors, or submodules. Control signals 128a, 128b may be control or actuator drive signals and may communicate DC offset or rail voltage, voltage or current magnitude, frequency, and phase components, etc. In various configurations, feedback control signals 128a, 128b can be used as inputs to one or multiple control loops. In various configurations, the multiple control loops can include a proportional-integral (PI), proportional-integral-derivative (PID) controllers, linear-quadratic-regulator (LQR) control loops, or subsets thereof, for RF drive, and for rail voltage. In various configurations, control signals 128a, 128b can be used in one or both of a single-input-single-output (SISO) or multiple-input-multiple-output (MIMO) control scheme. An example of a MIMO control scheme can be found with reference to U.S. Pat. No. 10,546,724, issued on Jan. 28, 2020, entitled Pulsed Bidirectional Radio Frequency Source/Load, assigned to the assignee of the present application, and incorporated by reference herein. In other configurations, signals 128a, 128b can provide feedforward control as described in U.S. Pat. No. 10,049,857, issued Aug. 14, 2018, entitled Adaptive Periodic Waveform Controller, assigned to the assignee of the present application, and incorporated by reference herein.

In various configurations, power supply system 110 can include controller 120'. Controller 120' may be disposed externally to either or both of RF generators 112a, 112b and may be referred to as external or common controller 120'. In various configurations, controller 120' may implement one or a plurality of functions, processes, or algorithms described herein with respect to one or both of controllers 120a, 120b. Accordingly, controller 120' communicates with respective RF generators 112a, 112b via a pair of respective links 136, 138 which enable exchange of data and control signals, as appropriate, between controller 120' and RF generators 112a, 112b. For the various configurations, controllers 120a, 120b, 120' can distributively and cooperatively provide analysis and control of RF generators 112a, 112b. In various other configurations, controller 120' can provide control of RF generators 112a, 112b, eliminating the need for the respective local controllers 120a, 120b.

In various configurations, RF power source 114a, sensor 116a, controller 120a, and matching network 118a can be referred to as source RF power source 114a, source sensor 116a, source controller 120a, and source matching network 118a, respectively. Similarly in various configurations, RF power source 114b, sensor 116b, controller 120b, and matching network 118b can be referred to as bias RF power source 114b, bias sensor 116b, bias controller 120b, and bias matching network 118b, respectively. In various configurations and as described above, the source term refers to the RF generator that generates a plasma, and the bias term refers to the RF generator that tunes ion potential and the Ion Energy Distribution Function (IEDF) of the plasma. In various configurations, the source and bias RF power supplies operate at different frequencies. In various configurations, the source RF power supply operates at a higher frequency than the bias RF power supply. In various other configurations, the source and bias RF power supplies operate at the same frequencies or substantially the same frequencies.

According to various configurations, source RF generator 112a and bias RF generator 112b include multiple ports to communicate externally. Source RF generator 112a includes pulse synchronization output port 140, digital communication port 142, RF output port 144, and control signal port 160. Bias RF generator 112b includes RF input port 148, digital communication port 150, and pulse synchronization input port 152. Pulse synchronization output port 140 outputs a pulse synchronization signal 156 to pulse synchronization input port 152 of bias RF generator 112b. Digital communication port 142 of source RF generator 112a and digital communication port 150 of bias RF generator 112b communicate via a digital communication link 157. Control signal port 160 of source RF generator 112a receives one or both of control signals 130, 130'. RF output port 144 generates a RF control signal 158 input to RF input port 148. In various configurations, RF control signal 158 is substantially the same as the RF control signal controlling source RF generator 112*a*. In various other configurations, RF control signal 158 is the same as the RF control signal controlling source RF generator 112*a*, but is phase shifted within source RF generator 112*a* in accordance with a requested phase shift generated by bias RF generator 112*b*. Thus, in various configurations, source RF generator 112*a* and bias RF generator 112*b* are driven by substantially identical RF control signals or by substantially identical RF control signal phase shifted by a predetermined amount.

In various configurations, power supply system 110 may include multiple RF source generators 112*a* and multiple RF bias generators 112*b*. By way of nonlimiting example, a plurality of source RF generators 112*a*, 112*a'*, 112*a"*, . . . , 112*a^n* can be arranged to provide a plurality of output power signals to one or more source electrodes of load 132. Similarly, a plurality of bias RF generators 112*b*, 112*b'*, 112*b"*, . . . , 112*b^n* may provide a plurality of output power signals to a plurality of bias electrodes of load 132. When source RF generator 112*a* and bias RF generator 112*b* are configured to include a plurality of respective source RF generators or bias RF generators, each RF generator will output a separate signal to a corresponding plurality of matching networks 118*a*, 118*b*, configured to operate as described above, in a one-to-one correspondence. In various other configurations, there may not be a one-to-one correspondence between each RF generator and matching network. In various configurations, multiple source electrodes may refer to multiple electrodes that cooperate to define a composite source electrode. Similarly, multiple bias electrodes may refer to multiple connections to multiple electrodes that cooperate to define a composite bias electrode.

Figure 2:
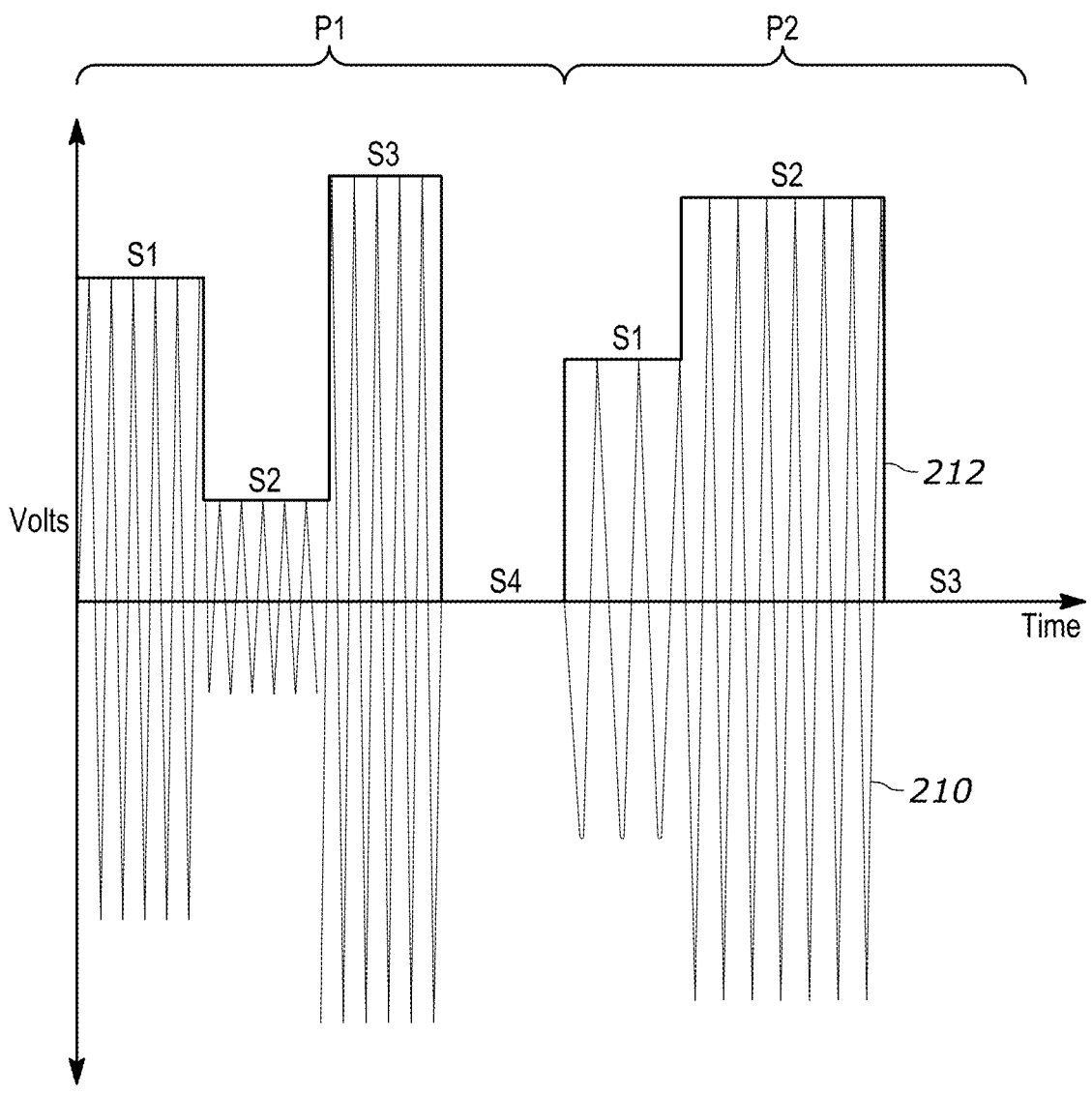
FIG. 2 shows waveforms of a RF signal and a pulse modulating the RF signal to describe a pulse mode of operation.

FIG. 2 depicts a plot of voltage versus time to describe a pulse or pulsed mode of operation for delivering power to a load, such as load 132 of FIG. 1. More particularly, FIG. 2 depicts two-multistate pulses P1, P2 of a pulse signal 212 having a respective plurality of states S1-S4 and S1-S3. In FIG. 2, RF signal 210 is modulated by pulses P1 and P2. As shown at states S1-S3 of P1 and S1-S2 of P2, when the pulses are ON, RF generator 112 outputs RF signal 210 having an amplitude defined by the pulse magnitude at each state. Conversely, during states S4 of P1 and S3 of P2, the pulses are OFF, and RF generator 112 does not output RF signal 210. Pulses P1, P2 can repeat at a constant duty cycle or a variable duty cycle, and states S1-S4, S1-S3 of each respective pulse P1, P2 may have the same or varying amplitudes and widths.

In various configurations, RF signal 210 need not be a implemented as a sinusoidal waveform as shown in FIG. 2. As referenced above with respect to FIG. 2, in addition to a sinusoidal waveform, in various configurations, RF signal 210 may be a non-sinusoidal waveform. By way of nonlimiting example, RF signal 210 may be a rectangular waveform pulsed in a repeated or intermittent manner or a piecewise linear waveform as described in U.S. Pat. No. 10,396,601. In various configurations, pulse signal 212 may be other than a square wave as shown in FIG. 2. Further, by way of nonlimiting example, an envelope or pulse signal 212 may be a rectangular, trapezoidal, triangular, sawtooth, gaussian, or other shape that defines an envelope or modulating envelope of the underlying, modulated RF signal. In various configurations, the pulse signal may occur or reoccur within fixed or variable periods or time periods. In various other configurations, the pulse signal may vary in shape between each occurrence. In various other configurations, the pulse signal may occur or reoccur within fixed or variable time periods and vary in shape between each occurrence. Further yet, pulses P1, P2 can have multiple states S1, . . . , Sn of varying amplitude, duration, and shape. States S1, . . . , Sn may repeat within fixed or variable periods and may include all or a portion of the various shapes described above. Also shown in FIG. 2, RF signal 210 may operate at frequencies that vary between states or within a state.

Figure 3A:
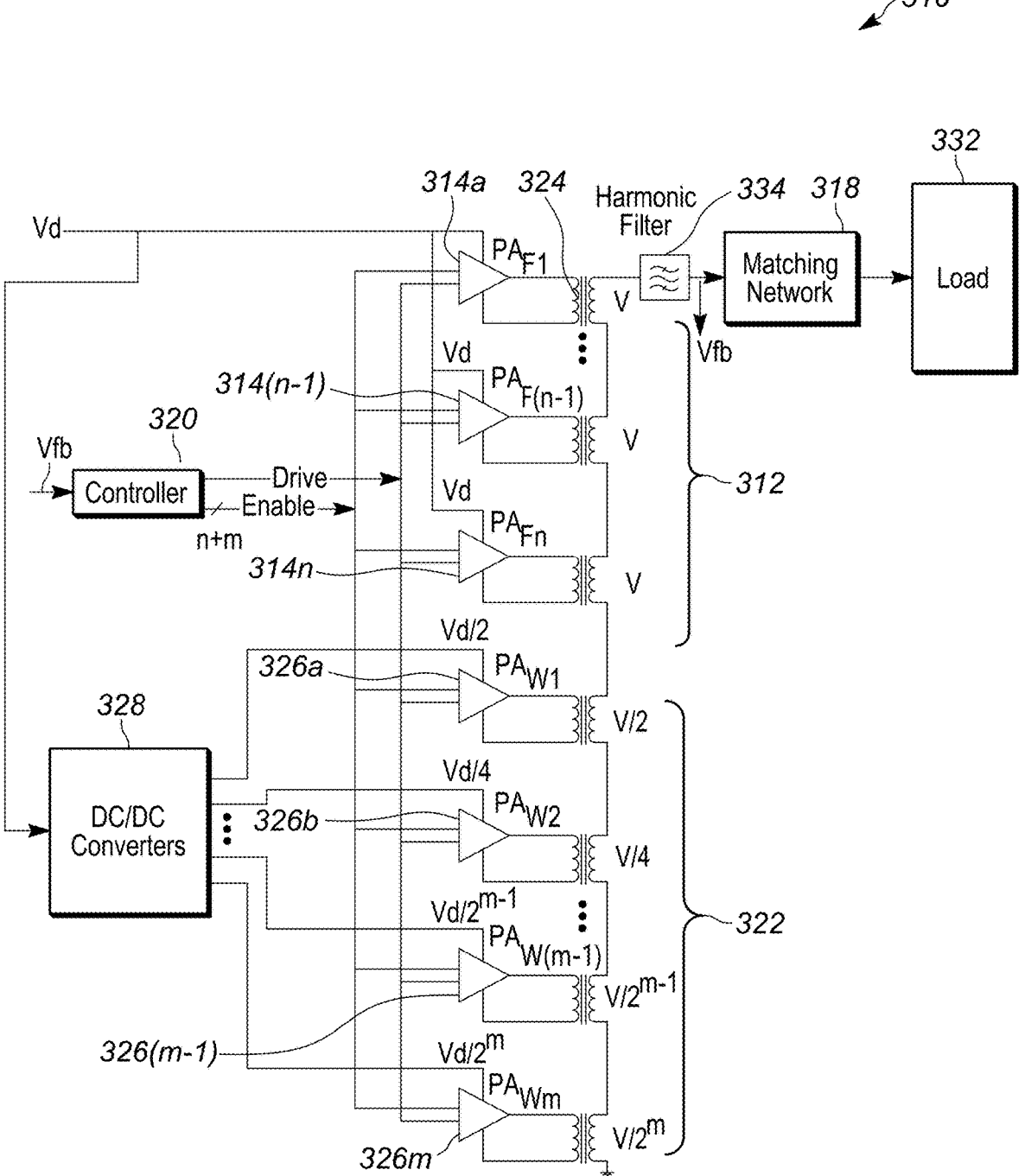
FIG. 3A shows a RF generator having multiple power amplifiers arranged according to various configurations of the present disclosure.

FIG. 3A shows a RF generator 310 arranged in accordance with the principles of the present disclosure. RF generator 310 includes shows a plurality of fixed voltage power amplifiers 314 and weighted voltage power amplifiers 326 that are combined in series to obtain a composite output voltage at the input of harmonic filter 334. Fixed power generation section 312 includes a plurality of fixed power supplies or power amplifiers 314*a*, . . . , 314(*n*–1), 314*n*, also referred to as PA$_{F1}$, . . . , PA$_{F(n-1)}$, PA$_{Fn}$, respectively. Fixed power amplifiers PA$_{F1}$, . . . , PA$_{F(n-1)}$, PA$_{Fn}$ each output a voltage signal or voltage V to a respective transformer 324, all arranged in series. Weighted power generation section 322 includes a plurality of weighted power supplies or power amplifiers 326*a*, 326*b*, . . . , 326(*m*–1), 326*m*, also referred to as PA$_{W1}$, PA$_{W2}$, . . . , PA$_{W(m-1)}$, PA$_{Wm}$. Weighted power amplifiers PA$_{W1}$, PA$_{W2}$, . . . , PA$_{W(m-1)}$, PA$_{Wm}$ each output a respective voltage signal or voltage $$\frac{V}{2^i},$$

where i indicates a subscript (1, 2, . . . , m–1, m) of a respective power amplifier, to a respective transformer 324, also all arranged in series. It should be noted that only one transformer 324 is labeled in FIG. 3A though all transformers shown in FIG. 3A are substantially the same or may vary by turns ratio and are arranged in series. In various configurations, a weighted power amplifier 326 and associated transformer 324 may be referred to as a weighted power amplifier module.

The voltage signals or voltages output from respective fixed power generation section 312 and weighted power generation section 322 are added via the series connection of transformers 324. The voltage generated via the series connection of transformers 324 is communicated to the input of harmonic filter 334. Harmonic filter 334 is configured to remove selected harmonics from the voltage signal input thereto. The output of harmonic filter 334 is input to matching network 318, which is arranged similarly to matching networks 118*a*, 118*b* of FIG. 1. Matching network 318 operates as described above and generates a matched voltage signal communicated to load 332, which may be configured similarly to load 132 above of FIG. 1. A sensor (not shown in FIG. 3A, but configured similarly to sensors 116*a*, 116*b* of FIG. 1) generates one or a plurality of feedback signals that vary in accordance with one or a plurality of respective electrical parameters, such as voltage and current in one nonlimiting example, communicated to controller 320. Controller 320 is configured to operate generally similarly to controllers 120, 120' described above with respect to FIG. 1 and further as described below.

Controller 320 receives the one or a plurality of feedback signals and other command inputs and generates enable and drive signals to each of the power amplifiers of fixed power generation section 312 and weighted power generation section 322. Controller 320 outputs a plurality (n+m) of enable signals, with one of the (n+m) signals input to a respective power amplifier 314, 326 to enable operation of the respective power amplifier. In various configurations, controller 320 outputs the plurality (n+m) enable signals via a bus structure. Controller 320 also outputs one or a plurality of drive signals applied to each power amplifier to control the frequency and phase of the voltage signal output by a respective power amplifier in accordance with the phase and frequency of the drive signal. The one or a plurality of feedback signals input to controller 320 are analyzed by controller 320, and controller 320 may vary the enable signals in order to vary the one or a plurality of electrical parameters detected to generate the one or a plurality of feedback signals. In various configurations, the enable signal is an individual signal applied to a respective power amplifier. In various configurations, the drive signal is a common signal buffered separately to each power amplifier.

As shown in FIG. 3A, supply voltage signal or supply voltage $V_d$ generated internally to RF generator 310 or received from an external source, which may be a regulated, non-isolated supply voltage. Supply voltage $V_d$ provides a voltage input directly to fixed power amplifiers 314 of fixed power generation section 312. Each power amplifier of fixed power generation section 312 outputs a voltage signal or voltage V when turned on and 0 V when turned off. The supply voltage $V_d$ is also input to one or plurality of direct-current/direct-current (DC/DC) convertors 328. In various configurations, DC/DC converters 328 receive the input voltage $V_d$ and output a fraction of $V_d$, which may be referred to as a weighted voltage signal or weighted voltage, to a respective power amplifier of weighted power amplifiers $PA_{W1}$, $PA_{W2}$, . . . , $PA_{W(m-1)}$, $PA_{Wm}$. Thus, power amplifiers $PA_{W1}$, $PA_{W2}$, . . . , $PA_{W(m-1)}$, $PA_{Wm}$ receive respective fractional voltage signals or voltages, and output corresponding fractions of V. Each power amplifier of weighted power generation section 322 outputs 0 V when turned off. The weighted voltages output by power amplifiers $PA_{W1}$, $PA_{W2}$, . . . , $PA_{W(m-1)}$, $PA_{Wm}$ provide step control to the smallest step of some fraction of V.

In one various configuration, DC/DC converters 328 receive the input voltage $V_d$ and output a binary fraction of $V_d$, represented as binary, weighted voltage signal or voltage $$\frac{V_d}{2^i},$$

to a respective power amplifier of weighted voltage power amplifiers $PA_{W1}$, $PA_{W2}$, . . . , $PA_{W(m-1)}$, $PA_{Wm}$, where i indicates the subscript (1, 2, . . . , m−1, m) of the respective, weighted power amplifier. Thus, power amplifiers $PA_{W1}$, $PA_{W2}$, . . . , $PA_{W(m-1)}$, $PA_{Wm}$ receive respective binary, weighted voltage signals or voltages $$\frac{V_d}{2^i},$$

and output binary fractions of V, represented as binary, weighted voltage signals or voltages $$\frac{V}{2^i},$$

where i indicates the subscript (1, 2, . . . , m−1, m) of the respective, weighted power amplifier. Each power amplifier of weighted power generation section 322 outputs 0 V when turned off. The binary weighted voltages output by power amplifiers $PA_{W1}$, $PA_{W2}$, . . . , $PA_{W(m-1)}$, $PA_{Wm}$ provide step control to the smallest step of $$\frac{V}{2^m}.$$

Controller 320 determines which amplifiers to enable based on the amplitude setpoint.

The arrangement of fixed power generation section 312 and weighted power generation section 322 enables a series connection of $PA_{F1}$, . . . , $PA_{F(n-1)}$, $PA_{Fn}$ and $PA_{W1}$, $PA_{W2}$, . . . , $PA_{W(m-1)}$, $PA_{Wm}$ to generate a combined series voltage input to harmonic filter 334. The combined voltage of fixed power generation section 312 varies in accordance with the number of power amplifiers $PA_{F1}$, . . . , $PA_{F(n-1)}$, $PA_{Fn}$ activated. By way of nonlimiting example, if one of power amplifiers $PA_{F1}$, . . . , $PA_{F(n-1)}$, $PA_{Fn}$ is activated, the voltage output from weighted power generation section 322 is V. Similarly, by way of nonlimiting example, if two of power amplifiers $PA_{F1}$, . . . , $PA_{F(n-1)}$, $PA_{Fn}$ are activated, the voltage output from weighted power generation 312 is 2V. Further by way of nonlimiting example, if n of power amplifiers $PA_{F1}$, . . . , $PA_{F(n-1)}$, $PA_{Fn}$ is activated, the voltage output from fixed power generation section 312 is nV.

In a similar manner, each power amplifier of weighted power generation section 322 outputs a binary fraction of voltage V equal to $$\frac{V}{2^i},$$

where i indicates the subscript (1, 2, . . . , m−1, m) of the power amplifier, when turned on and 0 V when turned off. The following indicates the voltage output from each respective power amplifier $PA_{W1}$, $PA_{W2}$, . . . , $PA_{W(m-1)}$, $PA_{Wm}$:

$$PA_{W1} \quad \frac{V}{2^1} = \frac{V}{2};$$

$$PA_{W2} \quad \frac{V}{2^2} = \frac{V}{4};$$

$$\vdots$$

$$PA_{W(m-1)} \quad \frac{V}{2^{m-1}};$$

$$PA_{Wm} \quad \frac{V}{2^m}$$

The combined voltage of weighted power generation section 322 varies in accordance with which power amplifiers $PA_{W1}$, $PA_{W2}$, . . . , $PA_{W(m-1)}$, $PA_{Wm}$ activated. By way of nonlimiting example, if only power amplifier $PA_{W1}$ is activated, the voltage output from weighted power generation section 322 is $$\frac{V}{2^1} = \frac{V}{2}.$$

Similarly, by way of nonlimiting example, if power amplifiers $PA_{W1}$ and $PA_{W2}$ are activated, the voltage output from weighted power generation section 322 is $$\left(\frac{V}{2^1} = \frac{V}{2}\right) + \left(\frac{V}{2^2} = \frac{V}{4}\right) = \frac{3V}{4}.$$

Further, by way of nonlimiting example, if two power amplifiers $PA_{W1}$ and $PA_{Wm}$, where m=6, are activated, the voltage output from weighted power generation section 322 is $$\left(\frac{V}{2^1} = \frac{V}{2}\right) + \left(\frac{V}{2^6} = \frac{V}{64}\right) = \frac{33V}{64}.$$

In one non-limiting example, weighted power generation section 322 can include six power sources or power amplifiers $PA_{W1}$, $PA_{W2}$, $PA_{W3}$, $PA_{W4}$, $PA_{W5}$, $PA_{W6}$ (m=6). Power amplifiers $PA_{W1}$, $PA_{W2}$, $PA_{W3}$, $PA_{W4}$, $PA_{W5}$, $PA_{W6}$ generate fixed output voltages of $$V/2,\ V/4,\ V/8,\ V/16,\ V/32,\ V/64 \left(\left(\frac{V}{2^i}\right)\right),$$

where i indicates the subscript (1, 2, . . . , m−1, m)), respectively. The addition of the binary weighted voltage power amplifiers provides fine step control to the smallest step of V/64 for a weighted power generation section 322 having six power amplifiers. Controller 320 determines which amplifiers to enable based on the amplitude setpoint. This power control scheme can produce an output quantization step voltage from zero volts to ((n+1)×64−1) volts (where n=the maximum number of active power amplifiers) at a resolution of $$\frac{v}{64}$$

volts per step. This allows the AC/DC front end power supplies that convert AC voltage to DC input voltage ($V_d$) input to the RF generator to be fixed voltage, non-isolated buck converters. Such a configuration enables a reduction in the size of the RF generator, providing an increase in power density.

Figure 3B:
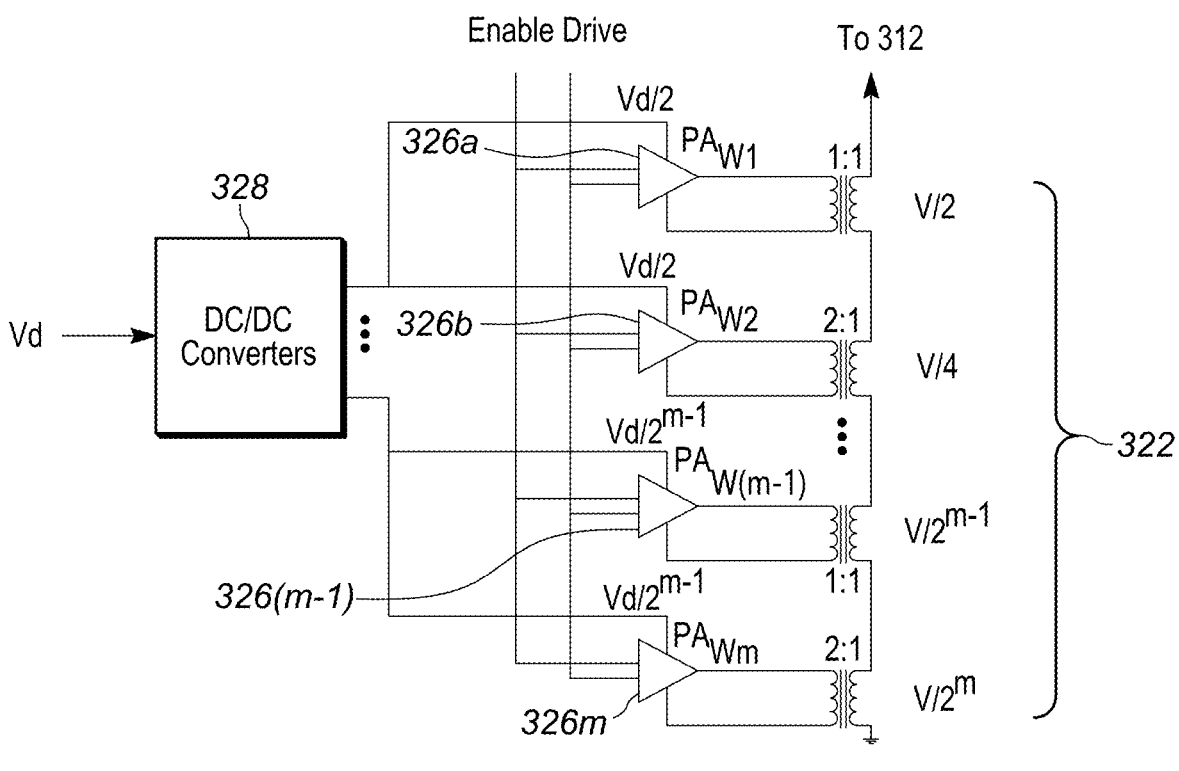
FIG. 3B shows the weighted power generation section of the RF generator of FIG. 3A arranged according to various configurations of the present disclosure.

FIG. 3B discloses one of various configurations of weighted power generation section 322. In FIG. 3B, transformers 324 associated with respective weighted power amplifiers $PA_{W1}$, $PA_{W2}$, . . . , $PA_{W(m-1)}$, $PA_{Wm}$ output the same voltage as corresponding transformers across weighted power amplifiers of FIG. 3A. However, in weighted power generation section 322 of FIG. 3B, the voltage generated across respective transformers 324 varies in accordance with the supply voltage input to the respective weighted power amplifiers and the turns ratios of the transformers at the output of the respective weighted power amplifiers. Such a configuration can reduce the number of DC/DC converters required to implement weighted power generation section 322.

By way of nonlimiting example, weighted power amplifiers $PA_{W1}$, $PA_{W2}$ each receive the same supply voltage $$\frac{V_d}{2}.$$

The transformer at the output of weighted power amplifier $PA_{W1}$, has a turns ratio of 1:1 (input:output), while the transformer at the output of weighted power amplifier $PA_{W2}$ has a turns ratio of 2:1. Thus, assuming that the supply voltage input to weighted power amplifiers $PA_{W1}$, $PA_{W2}$ is $$\frac{V_d}{2},$$

the output of weighted power amplifiers $PA_{W1}$, $PA_{W2}$ is $$\frac{V}{2}.$$

Because of the different turns ratios of the transformers associated with respective weighted power amplifiers $PA_{W1}$, $PA_{W2}$, the voltage across the transformer at the output of weighted power amplifier $PA_{W1}$ is $$\frac{V}{2},$$

and the voltage across the transformer at the output of weighted power amplifier $PA_{W2}$ is $$\frac{V}{4}.$$

Similarly, weighted power amplifiers $PA_{W(m-1)}$, $PA_{Wm}$ each receive the same supply voltage $$\frac{V_d}{2^{m-1}}.$$

The transformer at the output of weighted power amplifier $PA_{W(m-1)}$ has a turns ratio of 1:1, while the output of weighted power amplifier $PA_{Wm}$ has a turns ratio of 2:1. Thus, assuming that the supply voltage input to of weighted power amplifiers $PA_{W1}$, $PA_{W2}$ is $$\frac{V_d}{2^{m-1}},$$

the output of weighted power amplifiers $PA_{W1}$, $PA_{W2}$ is $$\frac{V}{2^{m-1}}.$$

Because of the different turns ratios, the voltage across the transformer at the output of $PA_{W(m-1)}$, is $$\frac{V}{2^{m-1}},$$

and the voltage across the transformer at the output of $PA_{Wm}$ is $$\frac{V}{2^m}.$$

Figure 3C:
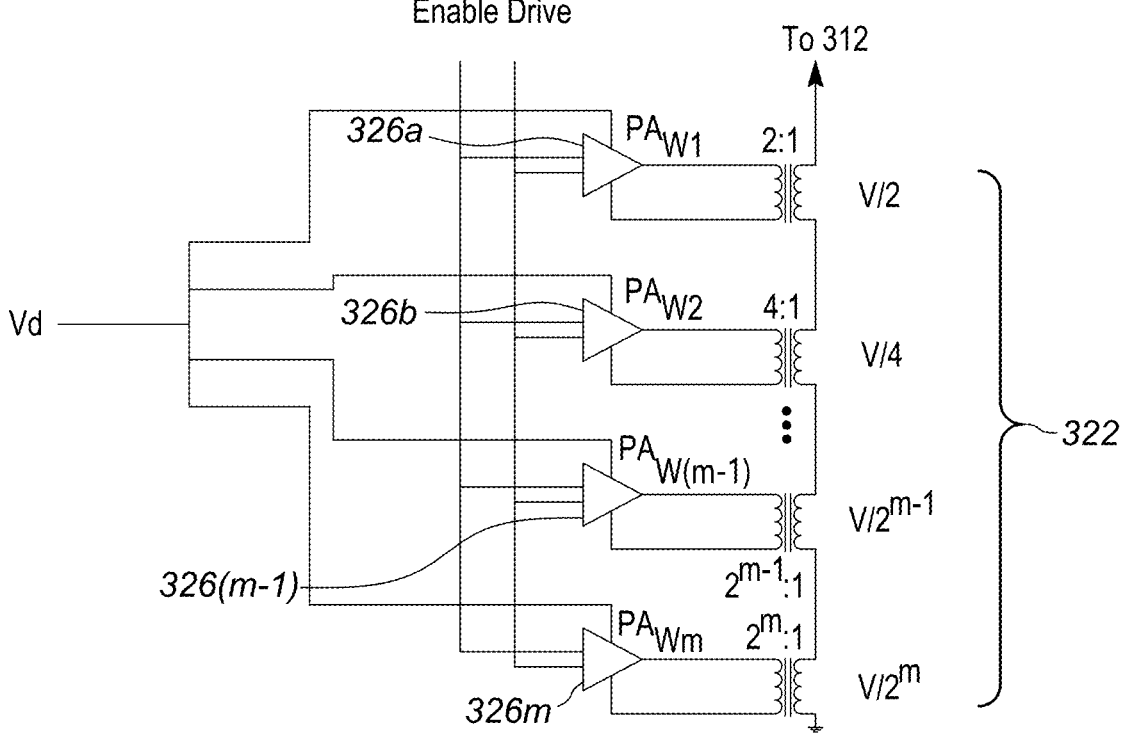
FIG. 3C shows the weighted power generation section of the RF generator of FIG. 3A arranged according to various configurations of the present disclosure.

FIG. 3C discloses one of various configurations of weighted power generation section 322. In FIG. 3C, transformers 324 associated with respective weighted power amplifiers $PA_{W1}$, $PA_{W2}$, . . . , $PA_{W(m-1)}$, $PA_{Wm}$ output the same voltage as corresponding transformers across weighted power amplifiers of FIG. 3A. However, in weighted power generation section 322 of FIG. 3C, each weighted power amplifier $PA_{W1}$, $PA_{W2}$, . . . , $PA_{W(m-1)}$, $PA_{Wm}$ receives the same supply voltage $V_d$ so that each weighted power amplifier $PA_{W1}$, $PA_{W2}$, . . . , $PA_{W(m-1)}$, $PA_{Wm}$ outputs the voltage V. The output across each transformer 324 associated with a respective weighted power amplifier varies in accordance with turns ratios of each the transformers. Such a configuration can reduce the number of DC/DC converters required to implement weighted power generation section 322.

By way of nonlimiting example, weighted power amplifiers $PA_{W1}$, $PA_{W2}$, . . . , $PA_{W(m-1)}$, $PA_{Wm}$ each receive the same supply voltage $V_d$. Transformer 324 at the output of weighted power amplifier, $PA_{W1}$, $PA_{W2}$, . . . , $PA_{W(m-1)}$, $PA_{Wm}$ has a respective turns ratio of $(2^i{:}1)$, where i is the subscript of each weighted power amplifier. Thus, the respective turns ratio of each transformer associated with a respective weighted power amplifier $PA_{W1}$, $PA_{W2}$, . . . , $PA_{W(m-1)}$, $PA_{Wm}$ is $(2^1{:}1)$, $(2^2{:}1)$, . . . , $(2^{m-1}{:}1)$, $(2^m{:}1)$. Thus, assuming that the supply voltage input to each weighted power amplifier $PA_{W1}$, $PA_{W2}$, . . . , $PA_{W(m-1)}$, $PA_{Wm}$ is $V_d$, the output of weighted power amplifiers $PA_{W1}$, $PA_{W2}$, . . . , $PA_{W(m-1)}$, $PA_{Wm}$ is $$\frac{V}{2}, \frac{V}{4}, \cdots, \frac{V}{2^{m-1}}, \frac{V}{2^m}.$$

In various configurations, weighted power generation section 322 can comprise a hybrid of FIGS. 3A and 3B. In a hybrid configuration, a first group or first plurality of weighted power amplifiers $PA_{W1}$, $PA_{W2}$, . . . , $PA_{W(m-1)}$, $PA_{Wm}$ can receive a first supply voltage signal or voltage $V_d$ or a fraction of $V_d$. Since each weighted power amplifier of the first group or first plurality receives the same supply voltage, the voltage across each transformer associated with a respective weighted power amplifier of the first plurality of weighted power amplifiers is determined in accordance with the turns ratio of each transformer. Similarly, a second group or second plurality of the weighted power amplifiers $PA_{W1}$, $PA_{W2}$, . . . , $PA_{W(m-1)}$, $PA_{Wm}$ can receive a second supply voltage signal or voltage $V_d$ or a fraction of $V_d$, where the second supply voltage signal or voltage is different than the first supply voltage signal or voltage. Since each weighted power amplifier of the second group or second plurality receives the same supply voltage, the voltage across each transformer associated with a respective weighted power amplifier of the second plurality of weighted power amplifiers is determined in accordance with the turns ratio of each transformer. In various configurations, a third group or third plurality of the weighted power amplifiers $PA_{W1}$, $PA_{W2}$, . . . , $PA_{W(m-1)}$, $PA_{Wm}$ can be similarly configured. In various configurations, the voltage across each transformer of weighted power generation section 322 varies to provide even steps as described above. In various other configurations, the voltage across each transformer may be a unique binary fraction of the output voltage V.

In wafer fabrication, plasma loads are highly nonlinear and are prone to rapid load transients during plasma ignition, arcing, and pulsing. A plasma load is represented as a complex impedance $Z=R\pm jX$. The impedance Z is transformed through the function of the matching network, such as matching network 118a, 118b, or 318 described above, and harmonic filter 334, back to the fixed power amplifiers 314 and weighted power amplifiers 326 of RF generator 310. In various configurations, it is generally desirable if the load impedance of RF generator 310, and its power amplifiers, is inductive, which occurs when $Z=R+jX$. If the impedance is capacitive, which occurs when $Z=R-jX$, the power amplifiers experience higher losses, lower efficiency, and lower reliability. The optimum RF power amplifier load impedance is inductive, $Z=R\pm jX$, which is where the power amplifiers achieve peak performances and highest efficiency. Accordingly, harmonic filter 334 in various configurations is designed to add large inductance with positive phase angle to shift the power amplifier load impedance toward a more inductive phase angle. Such a configuration improves efficiency of RF generator 310 and favorably modifies the plasma impedance lobe.

Figure 4:
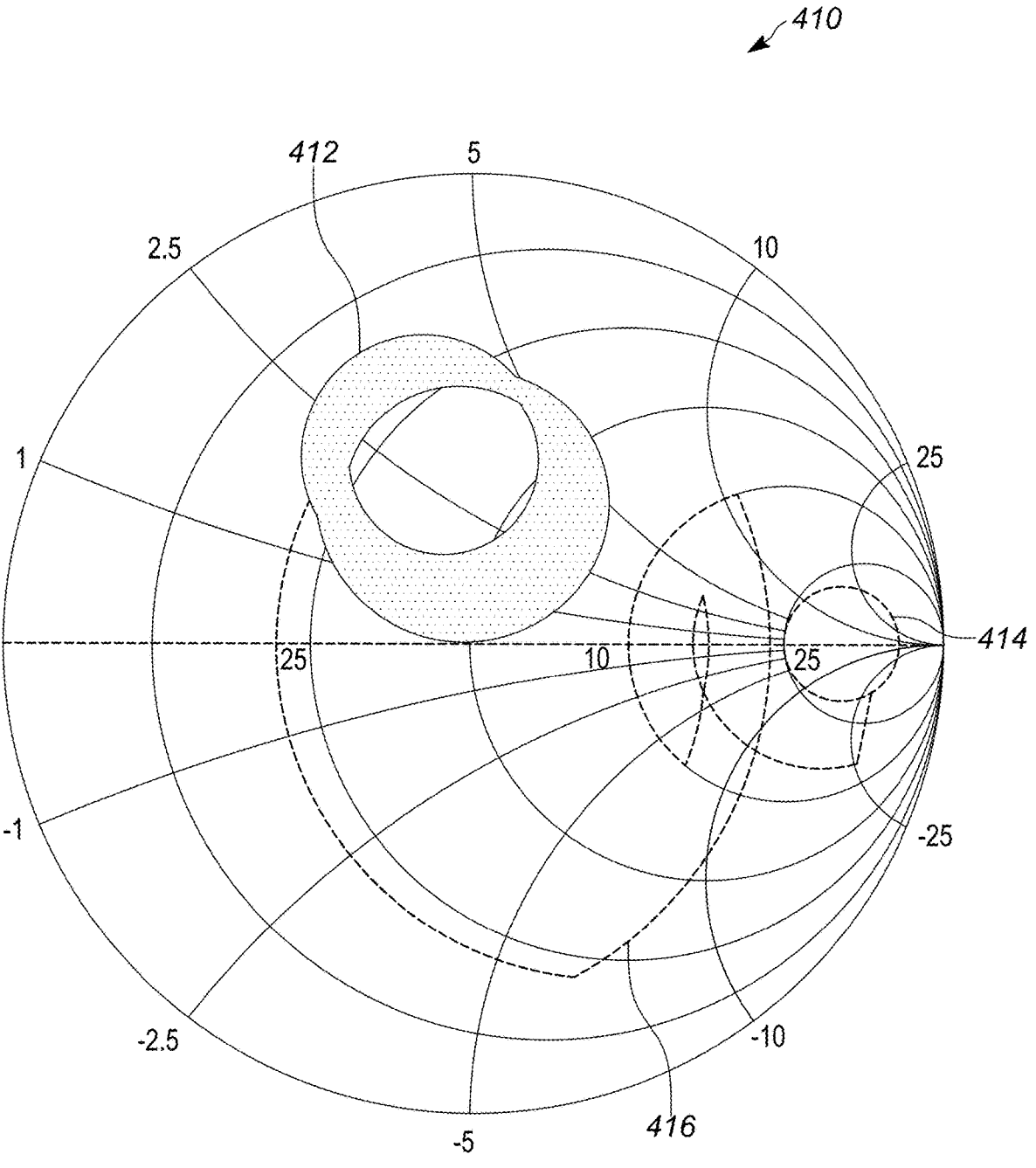
FIG. 4 shows a Smith chart to describe an area of inductive operation of the RF generator arranged according to various configurations of the present disclosure.

FIG. 4 shows a Smith chart 410 which will be used to further describe operation of RF power amplifiers having an impedance transformation to an inductive portion of Smith chart 410. Impedance circle 414 shows a typical impedance for a power amplifier driving a plasma load where no inductive load shifting occurs, such as provided by harmonic filter 334. Impedance circle 414 may also be referred to as a plasma impedance lobe. Using harmonic filter 334, the RF power amplifier shifts from impedance circle 414 along impedance transformation path 416 to impedance circle 412. Impedance circle 412 represents an inductive area of operation of the RF generator 310. As shown in FIG. 4, impedance circle 412 appears generally cylindrical. Further, impedance transformation path 416 represents a 7 order or 7 pole transformation. Thus, harmonic filter 334 transforms operation of fixed power amplifiers 314 and weighted power amplifiers 326 of RF generator 310 to an inductive mode of operation by skewing the power amplifier impedance from a low impedance to the top half (above the horizontal axis) of Smith chart 410.

Figure 5:
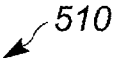
FIG. 5 shows a plot of power output and voltage output by the RF generator in response to drive word controlling the respective power amplifiers of the RF generator for a square root scaling control configuration.
Figure 5:
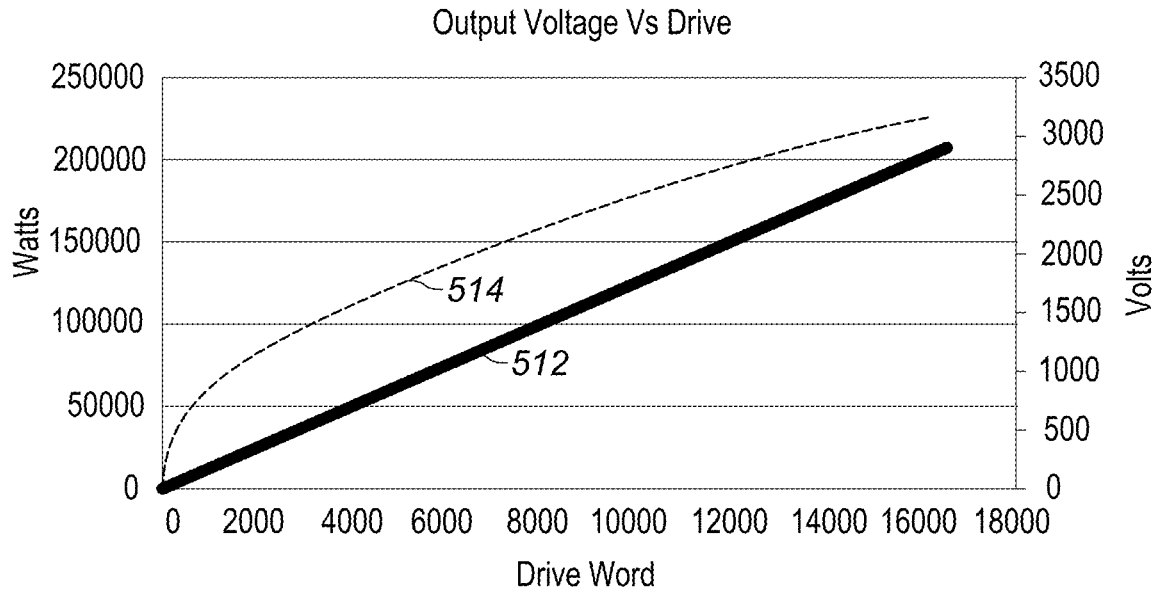
Figure 6:
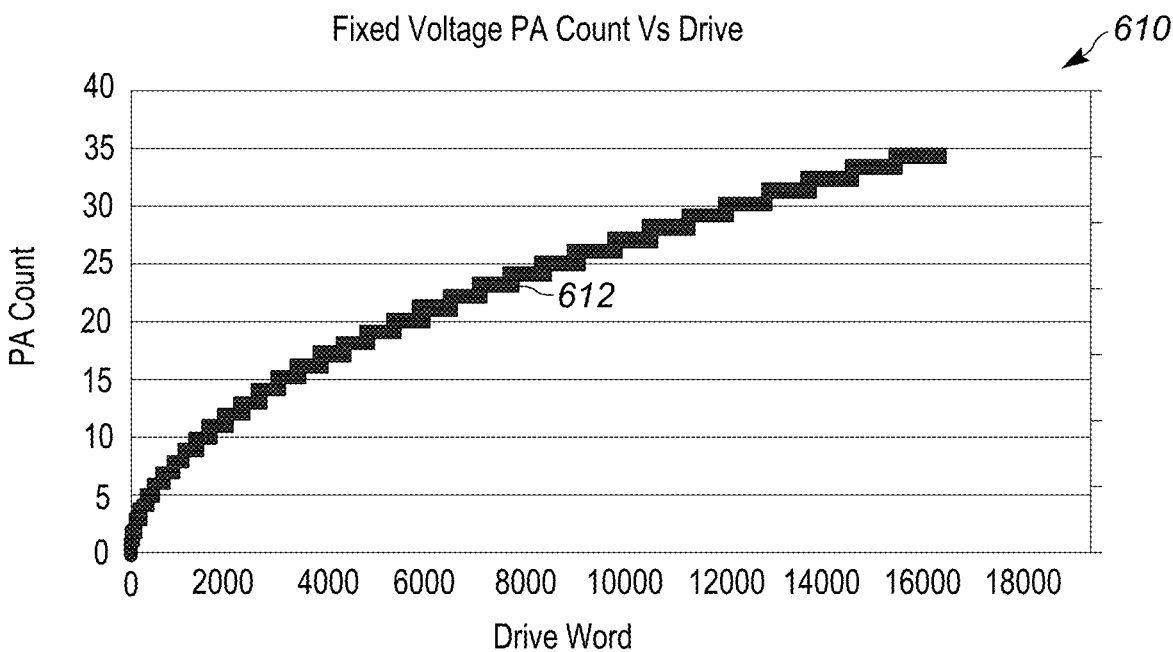
FIG. 6 shows a plot of the number power amplifiers of the fixed power generation section activated in response to a drive word for a square root scaling control configuration.
Figure 7:
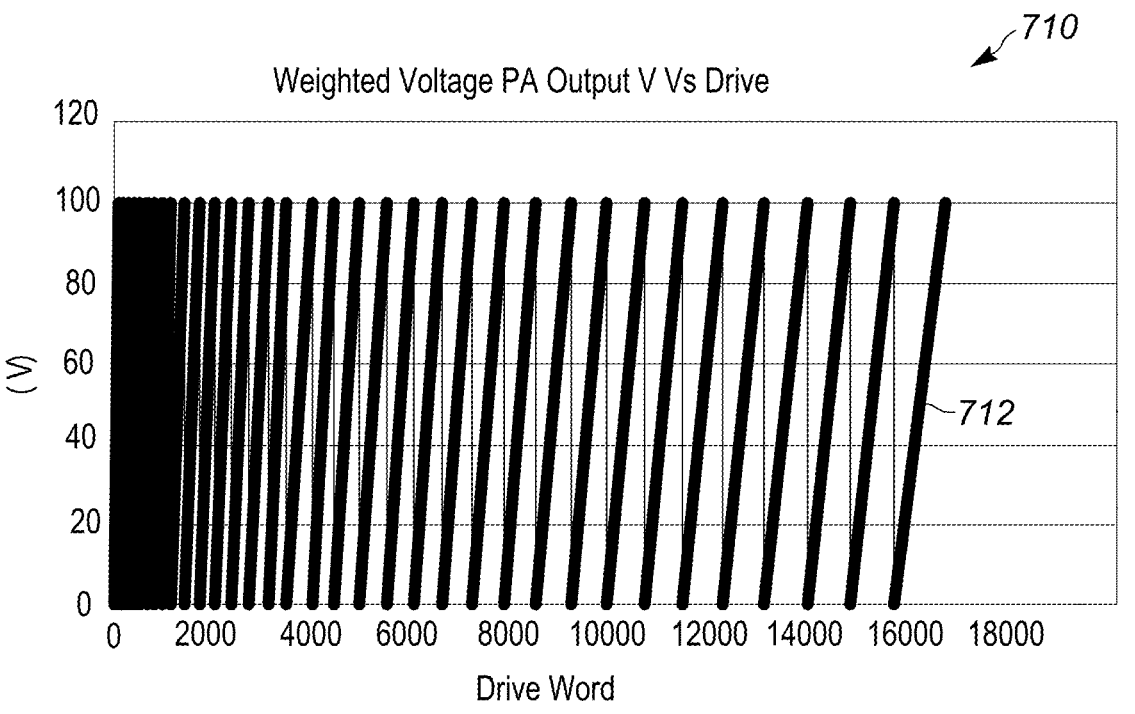
FIG. 7 shows a plot of weighted voltage output by the power amplifiers of weighted power generation section of the RF generator in response to a drive word controlling the power amplifiers for a square root scaling control configuration.

FIGS. 5-7 show graphs for an example control scheme in which the drive actuator of a feedback, feedforward, or MIMO controller is transformed so that the output power is linear with linear changes in drive actuator and the output voltage follows a square root of the output power. FIG. 5 shows a graph 510 including a plot of output power 512 with respect to a drive actuator or drive word, and a plot of output voltage 514 with respect to the drive actuator or drive word. The drive word indicates which power amplifiers, such as the power amplifiers shown in FIGS. 3A-3C, to turn on and off. In FIG. 5, output power 512 is linear with respect to the drive word, while output voltage 514 is shown as the square root of output power 512. In various configurations, to achieve a smooth, monotonic, and linear power characteristic, the controller, such as controller 320 of FIGS. 3A-3C, enables the fixed voltage power amplifiers of fixed power generation section 312 and the binary weighted power amplifiers of weighted power generation section 322 in order to provide the desired output power. FIG. 6 shows a graph 610 including a plot 612 that depicts the relation between the drive word and the power amplifier count. The power amplifier count indicates the number of power amplifiers of fixed power generation section 312 that are actuated in order to provide coarse voltage steps. FIG. 7 shows a graph 710 including a plot 712 of the drive word versus weighted power amplifier output voltage output by weighted power generation section 322. The voltage output by weighted power generation section 322 provides fine tuning voltage steps. In a nonlimiting example of FIGS. 5-7, each power amplifier of fixed power generation section 312 is configured to output 98V for a given supply voltage $V_d$. Similarly, in a nonlimiting example of FIGS. 5-7, each power amplifier of weighted power generation section 322 is configured to output a binary fraction of 98V in accordance with the supply voltage $$\frac{V_d}{2^i}$$

output oy DC/DC converters 328 for a given supply voltage $V_d$, where there are six weighted power amplifiers. Thus, from FIGS. 5-6, coarse voltage steps are created by enabling the correct number of fixed voltage power amplifiers, as shown in FIG. 6, and fine tuning voltage steps are provided by enabling the correct combination of weighted power amplifiers, such as showing in FIG. 7.

Figure 8:
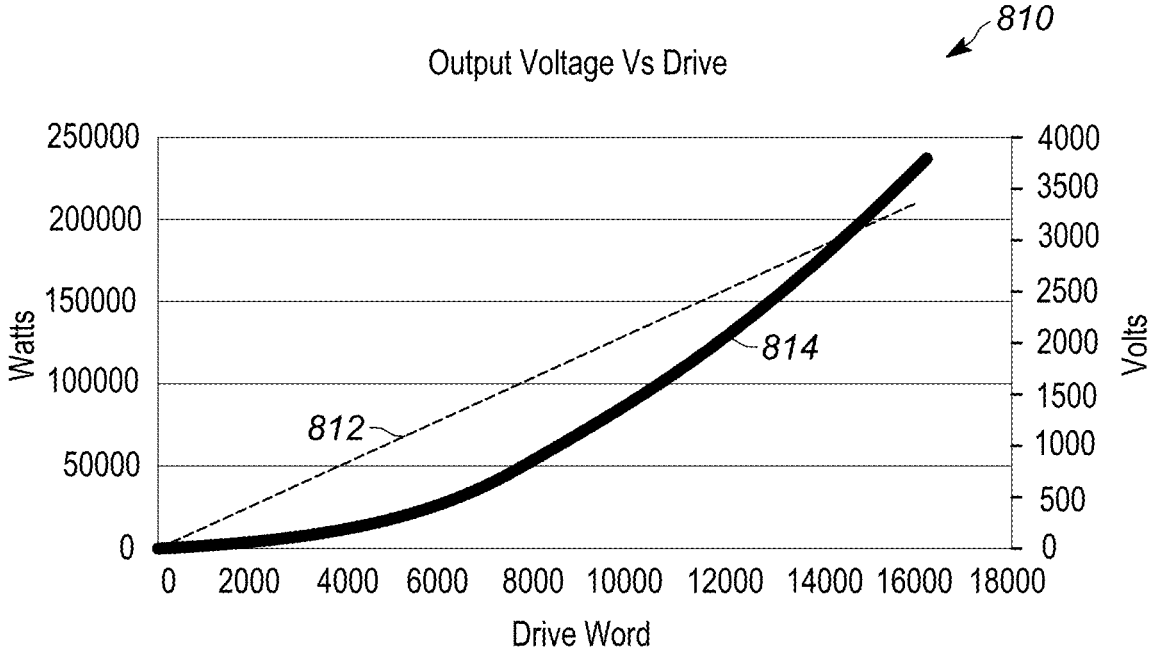
FIG. 8 shows a plot of the number power amplifiers of the fixed power generation section activated in response to a drive word for a linear scaling control configuration.
Figure 9:
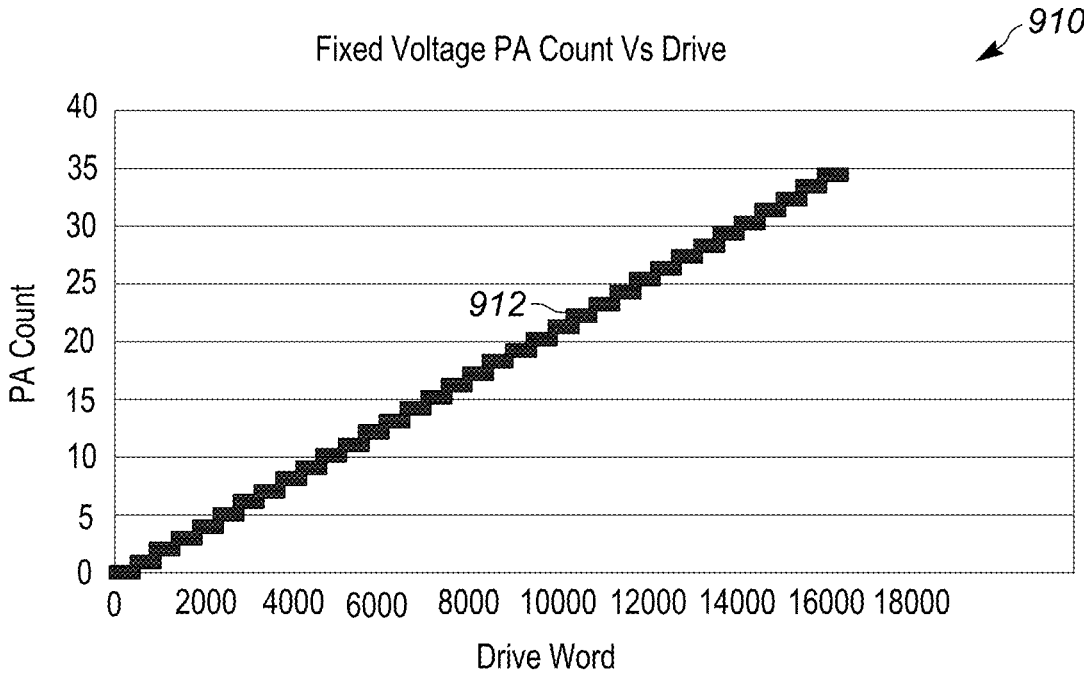
FIG. 9 shows a plot of the number power amplifiers of the fixed power generation section activated for a drive word for a linear scaling control configuration.
Figure 10:
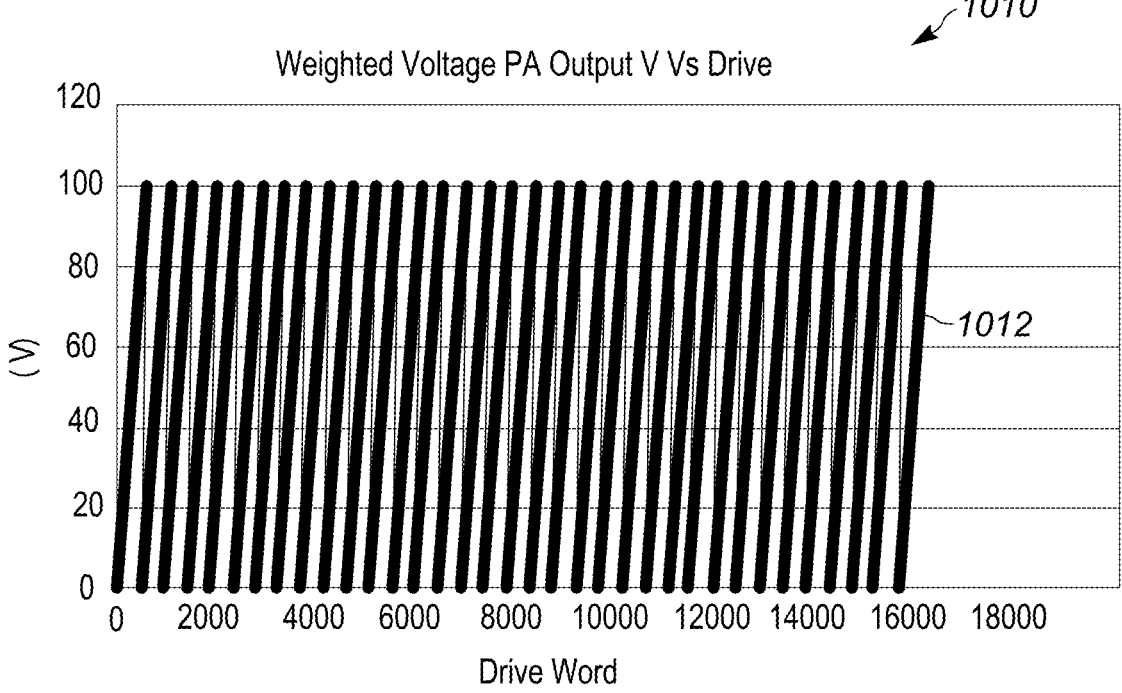
FIG. 10 shows a plot of weighted voltage output by the power amplifiers of weighted power generation section of the RF generator in response to a drive word controlling the power amplifiers for a linear scaling control configuration.

FIGS. 8-10 show graphs for an example control scheme in which the drive actuator of a feedback, feedforward, or MIMO controller is transformed so that the output voltage is linear with respect to the drive actuator and the output power follows a square of the output voltage. FIG. 8 shows a graph 810 including a plot of output voltage 812 with respect to a drive actuator or drive word, and a plot of output power 814 with respect to the drive actuator or drive word. The drive word indicates which power amplifiers, such as the power amplifiers shown in FIGS. 3A-3C, to turn on and off. In FIG. 8, output voltage 812 is linear with respect to the drive word, while the output power 814 is shown as the square of the output voltage 812. In various configurations, to achieve a smooth, monotonic, and linear voltage characteristic, the controller, such as controller 320 of FIGS. 3A-3C, enables the fixed voltage power amplifiers of fixed power generation section 312 and the binary weighted power amplifiers of weighted power generation section 322 in order to provide the desired output power. FIG. 9 shows a graph 910 including a plot 912 which depicts the relation between the drive word and the power amplifier count. The power amplifier count indicates the number of power amplifiers of fixed power generation section 312 that are actuated in order to provide coarse voltage steps. FIG. 10 shows a graph 1010 including a plot 1012 of the drive word versus weighted power amplifier output voltage output by weighted power generation section 322. The voltage output by weighted power generation section 322 provides fine tuning voltage steps. In a nonlimiting example of FIGS. 8-10, each power amplifier of fixed power generation section 312 is configured to output 98V for a given supply voltage $V_d$. Similarly, in a nonlimiting example of FIGS. 8-10, each power amplifier of weighted power generation section 322 is configured to output a binary fraction of 98V in accordance with the supply voltage $$\frac{V_d}{2^i}$$

output by DC/DC converters 328 for a given supply voltage $V_d$, where there are six weighted power amplifiers. Thus, from FIGS. 8-10, coarse voltage steps are created by enabling the correct number of fixed voltage power amplifiers, as shown in FIG. 9, and fine tuning voltage steps are provided by enabling the correct combination of weighted power amplifiers, such as showing in FIG. 10.

Figure 11:
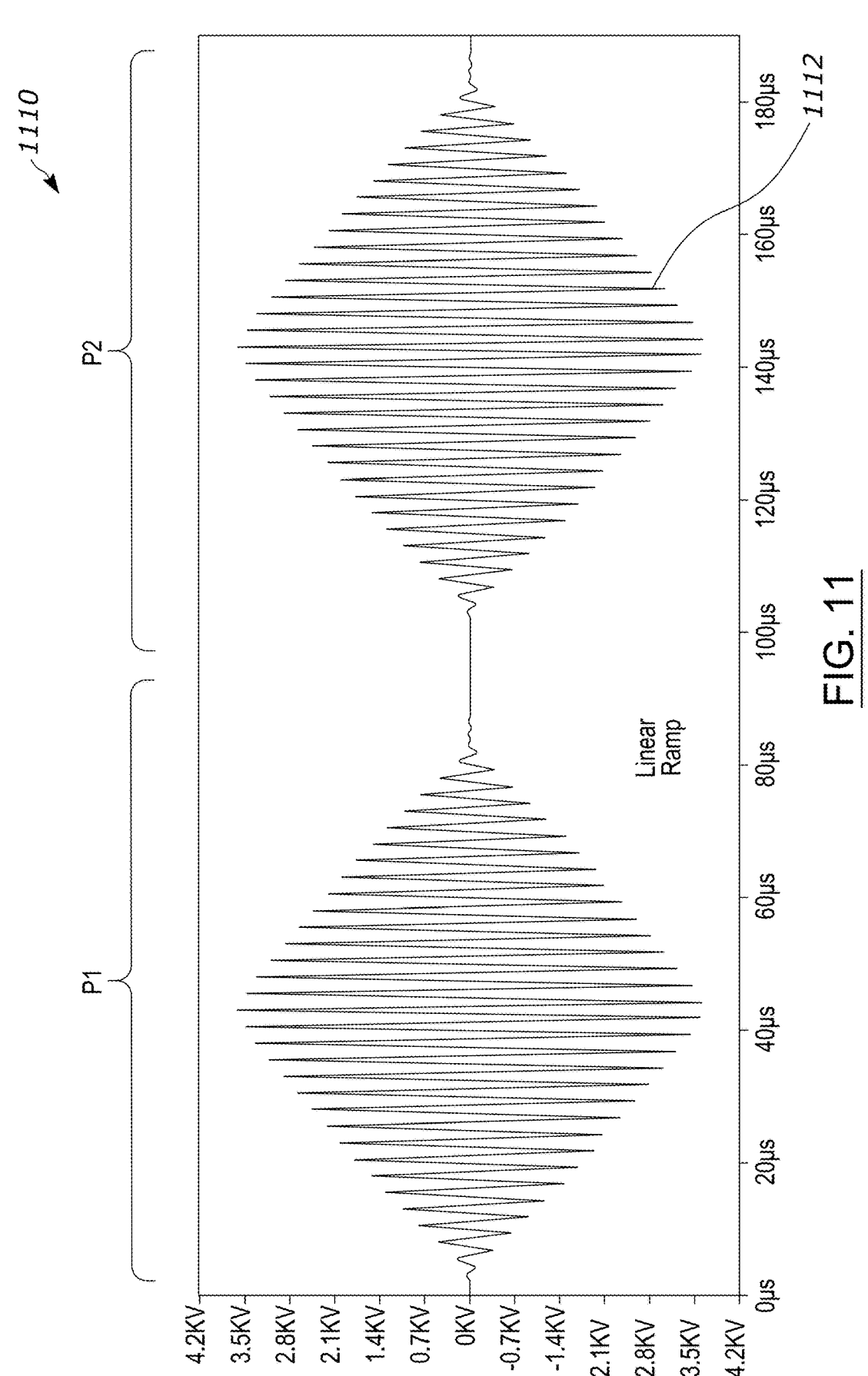
FIG. 11 shows an example of an envelope modulation with linear voltage ramps output by the RF generator arranged in accordance with the present disclosure.

FIG. 11 shows graph 1110 having a plot or waveform 1112 depicting a linear ramp pulse envelope. The pulse envelope of FIG. 11 shows two pulses P1, P2, each having a repetition rate of 10 kHz. Feedforward control can be used to regulate the pulse shape during rapid impedance changes that occur while driving the plasma. In addition, MIMO control can be used to simultaneously control the drive actuator and frequency actuator to regulate the pulse shape and minimize reflected power. Present semiconductor etch and deposition processes require bias generators that can produce complex amplitude modulation envelopes, also referred to as multi-state pulsing. The RF generator described in this disclosure provides higher performance than prior RF generators because the output voltage amplitude can change nearly instantaneously at the zero crossing of the RF output.

Figure 12:
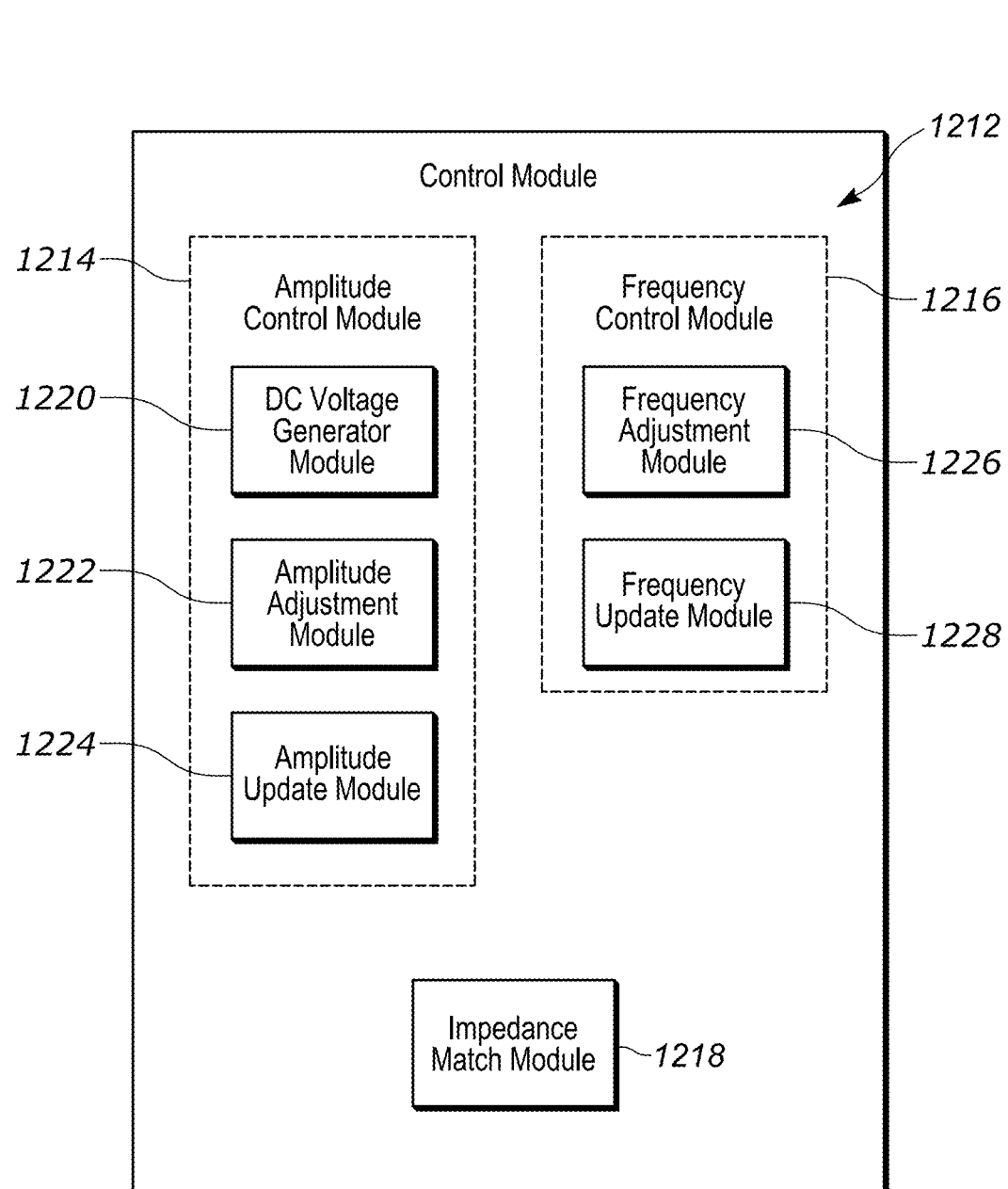
FIG. 12 shows a functional block diagram of an example control module arranged according to various configurations of the present disclosure.

FIG. 12 incorporates various components of FIGS. 1-11. Control module 1210 may include power generation module 1212, including amplitude control module section 1214 and frequency control module section 1216, and impedance match module 1218. Amplitude control module section 1214 includes DC voltage generator module 1220, amplitude adjustment module 1222, and amplitude update module 1224. Frequency control module section 1216 includes frequency adjustment module 1226 and frequency update module 1228. In various configurations, control module 1210 includes one or a plurality of processors that execute code associated with the module sections or modules 1210, 1212, 1214, 1216, 1218, 1220, 1222, 1224, 1226, and 1228. Operation of the module sections or modules 1210, 1212, 1214, 1216, 1218, 1220, 1222, 1224, 1226, and 1228 is described below with respect to the method of FIG. 13.

For further defined structure of controllers 120a, 120b, and 120' of FIG. 1, see the below provided flow chart of FIG. 13 and the below provided definition for the term "module". The systems disclosed herein may be operated using numerous methods, examples, and various control system methods of which are illustrated in FIG. 1. Although the following operations are primarily described with respect to the implementations of FIG. 1, the operations may be easily modified to apply to other implementations of the present disclosure. The operations may be iteratively performed. Although the following operations are shown and primarily described as being performed sequentially, one or more of the following operations may be performed while one or more of the other operations are being performed.

Figure 13:
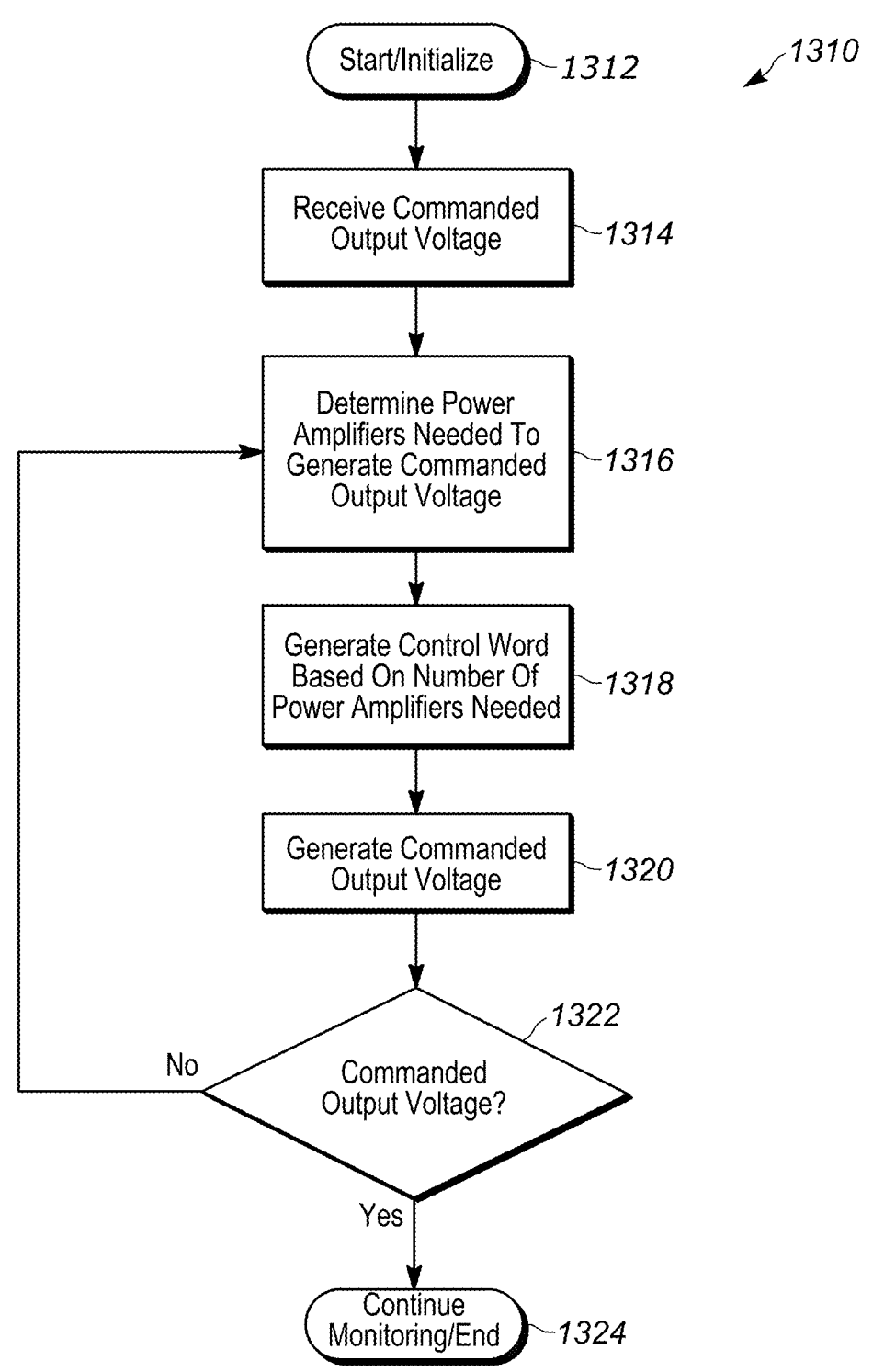
FIG. 13 shows a flow chart of operation of a control system arranged in accordance with the principals of the present disclosure.

FIG. 13 shows a flow chart of a control system 1310 for performing mode-based impedance control for, in a nonlimiting example, the power delivery system of FIG. 1. Control begins at start/initialize block 1312. Control proceeds to block 1314 at which the commanded output voltage is received. Control proceeds to block 1316 where the number of power amplifiers of fixed power generation section 312 and which power amplifiers of weighted power generation section 322 needed to generate the commanded output voltage is determined. Control proceeds to block 1318 which generates a control word based on the number of power amplifiers required to generate the commanded output voltage. Control proceeds to block 1320 which generates the output voltage in accordance with the control word by generating the drive and enable signals to each power amplifier. Control proceeds to block 1322 where it is determined whether the commanded output voltage has been generated. If the commanded output voltage has not been generated, control proceeds to block 1316 and repeats to update power amplifier control signals in order to advance towards the commanded output voltage. If the commanded output voltage has been achieved, control proceeds to block 1324 which ends the process but continues monitoring the output voltage.

Plasma loads are highly nonlinear and are prone to rapid load transients during plasma ignition, arcing, and pulsing. The RF generator described in this disclosure can be configured to protect the circuits from mismatched loads by rotating the power amplifiers of the fixed power generation section 312 in and out of operation to prevent overheating. The rotation occurs at the zero-crossing of the PA module output waveform and does not disturb the overall output of RF generator 310. In the above-described RF generator, fixed power generation section 312 is described as having n fixed power amplifiers 314*a*, . . . , 314(*n*−1), 314*n*, also referred to as $PA_{F1}$, . . . , $PA_{F(n-1)}$, $PA_{Fn}$, respectively. Similarly, weighted power generation section 322 is described as having m power amplifiers 326*a*, 326*b*, . . . , 326(*m*−1), 326*m*, also referred to as $PA_{W1}$, $PA_{W2}$, . . . , $PA_{W(m-1)}$, $PA_{Wm}$. In various configurations, if n=N and m=

$$\left((N+1) \times V - \frac{V}{2^M}\right)$$

volts.

In various configurations, the total output voltage can be limited to a number less than the output voltage that the total number of power amplifiers can output. By way of nonlimiting example, if n=N+A, fixed power generation section 312 may include (N+A) power amplifiers, but no more than N power amplifiers of fixed power generation section 312 can be activated at one time. In such a configuration, operation of the (N+A) power amplifiers can be rotated so that all of the (N+A) power amplifiers have on periods and off periods in order to prevent overheating. In such a configuration, rotation occurs at zero crossing of the power amplifier output module waveform so as to not disturb the overall output of RF generator 310.

In a conventional, phase shifted Class D power amplifier, such as may be implemented in the power amplifiers of FIGS. 3A-3C, a typical failure involves the main power amplifier device shorting to ground, resulting in the loss of control and power. When such an event occurs in a wafer fabrication process, it is possible that the wafer may need to be scrapped. In the RF plasma generator of the present disclosure, an increased count of independent, identical amplifiers can produce improved granularity for redundancy. By way of nonlimiting example, the (N+A) power amplifiers described above create an additional inventory of A power amplifiers, enabling a power amplifier to be omitted from the rotation if it has failed. Accordingly, if a power amplifier has failed, the failed amplifier does not impact the remaining amplifiers, since the power amplifiers are combined using transformers 324 in series. In various configurations, a fault sensor may be associated with each power amplifier in order to provide indication of a failure of a respective power amplifier at the time that it occurs. Further, in various configurations, each power amplifier is individually fused to isolate the power amplifier from the bulk voltage supply in the event of a short-circuit of that particular power amplifier. This allows voltage to remain uninterrupted to the other RF power amplifiers. Further, at the next zero crossing, the failed power amplifier is identified and switched out in favor of a replacement power amplifier in order to minimize any output disturbances.

The RF power generator described herein may provide one or more of the following benefits. The RF power generator described herein provides higher power density, since a non-isolated, fixed voltage buck regulator may be used to generate $V_d$. Such a voltage regulator is smaller than an isolated agile rail voltage supply. The RF power generator described herein provides improved pulsing performance, since it can enable generation of narrower pulses, higher peak/average power ratios, and complex envelopes due to faster actuation rates. The RF power generator described herein provides higher power efficiency during multi-level pulsing because power amplifier modules are either on or off, and no power is wasted during low power portions of the pulse envelope, since power amplifiers that are not needed are disabled. The RF power generator described herein provides low harmonic distortion at even harmonic frequencies because the inherent symmetry of the output waveform reduces even harmonics and simplifies harmonic output filters, since even harmonics need not be filtered. The RF power generator described herein provides higher dynamic range, on the order of >60 dB dynamic range. The RF power generator described herein enables alignment of power changes with the pulse state since the power amplifier inherently actuates amplitude changes aligned to pulse state changes, which improves plasma stability in a pulse mode of operation. The RF power generator described herein provides fast response time. The fast response time results from a constant voltage power supply powering all of the power amplifiers. This eliminates the power supply control loop and resultant response time and removes turn on delay used in other designs. Series combined power amplifiers are enabled on/off in synchronization on every RF clock cycle and produce an output quantization step voltage from zero volts to ((n+1)×64-1) volts (where n=the maximum number of active fixed power amplifiers) at a resolution of $$\frac{V}{64}$$

volts per step, when there are six weighted power amplifiers.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. In the written description and claims, one or more steps within a method may be executed in a different order (or concurrently) without altering the principles of the present disclosure. Similarly, one or more instructions stored in a non-transitory computer-readable medium may be executed in a different order (or concurrently) without altering the principles of the present disclosure. Unless indicated otherwise, numbering or other labeling of instructions or method steps is done for convenient reference, not to indicate a fixed order.

Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements.

The phrase "at least one of A, B, and C" should be construed to mean a logical (A OR B OR C), using a non-exclusive logical OR, and should not be construed to mean "at least one of A, at least one of B, and at least one of C." The term "set" does not necessarily exclude the empty set—in other words, in some circumstances a "set" may have zero elements. The term "non-empty set" may be used to indicate exclusion of the empty set—in other words, a non-empty set will always have one or more elements. The term "subset" does not necessarily require a proper subset. In other words, a "subset" of a first set may be coextensive with (equal to) the first set. Further, the term "subset" does not necessarily exclude the empty set—in some circumstances a "subset" may have zero elements.

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" can be replaced with the term "controller" or the term "circuit." In this application, the term "controller" can be replaced with the term "module." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); processor hardware (shared, dedicated, or group) that executes code; memory hardware (shared, dedicated, or group) that stores code executed by the processor hardware; other suitable hardware components that provide the described functionality; or a combination of some or all of the above, such as in a system-on-chip.

The module may include one or more interface circuits. In some examples, the interface circuit(s) may implement wired or wireless interfaces that connect to a local area network (LAN) or a wireless personal area network (WPAN). Examples of a LAN are Institute of Electrical and Electronics Engineers (IEEE) Standard 802.11-2020 (also known as the WIFI wireless networking standard) and IEEE Standard 802.3-2018 (also known as the ETHERNET wired networking standard). Examples of a WPAN are IEEE Standard 802.15.4 (including the ZIGBEE standard from the ZigBee Alliance) and, from the Bluetooth Special Interest Group (SIG), the BLUETOOTH wireless networking standard (including Core Specification versions 3.0, 4.0, 4.1, 4.2, 5.0, and 5.1 from the Bluetooth SIG).

The module may communicate with other modules using the interface circuit(s). Although the module may be depicted in the present disclosure as logically communicating directly with other modules, in various implementations the module may actually communicate via a communications system. The communications system includes physical and/or virtual networking equipment such as hubs, switches, routers, and gateways. In some implementations, the communications system connects to or traverses a wide area network (WAN) such as the Internet. For example, the communications system may include multiple LANs connected to each other over the Internet or point-to-point leased lines using technologies including Multiprotocol Label Switching (MPLS) and virtual private networks (VPNs).

In various implementations, the functionality of the module may be distributed among multiple modules that are connected via the communications system. For example, multiple modules may implement the same functionality distributed by a load balancing system. In a further example, the functionality of the module may be split between a server (also known as remote, or cloud) module and a client (or, user) module. For example, the client module may include a native or web application executing on a client device and in network communication with the server module.

Some or all hardware features of a module may be defined using a language for hardware description, such as IEEE Standard 1364-2005 (commonly called "Verilog") and IEEE Standard 1076-2008 (commonly called "VHDL"). The hardware description language may be used to manufacture and/or program a hardware circuit. In some implementations, some or all features of a module may be defined by a language, such as IEEE 1666-2005 (commonly called "SystemC"), that encompasses both code, as described below, and hardware description.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

The memory hardware may also store data together with or separate from the code. Shared memory hardware encompasses a single memory device that stores some or all code from multiple modules. One example of shared memory hardware may be level 1 cache on or near a microprocessor die, which may store code from multiple modules. Another example of shared memory hardware may be persistent storage, such as a solid state drive (SSD), which may store code from multiple modules. Group memory hardware encompasses a memory device that, in combination with other memory devices, stores some or all code from one or more modules. One example of group memory hardware is a storage area network (SAN), which may store code of a particular module across multiple physical devices. Another example of group memory hardware is random access memory of each of a set of servers that, in combination, store code of a particular module.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of a non-transitory computer-readable medium are nonvolatile memory devices (such as a flash memory device, an erasable programmable read-only memory device, or a mask read-only memory device), volatile memory devices (such as a static random access memory device or a dynamic random access memory device), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. Such apparatuses and methods may be described as computerized apparatuses and computerized methods. The functional blocks and flowchart elements described above serve as software specifications, which can be translated into the computer programs by the routine work of a skilled technician or programmer.

The computer programs include processor-executable instructions that are stored on at least one non-transitory computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C #, Objective C, Swift, Haskell, Go, SQL, R, Lisp, Java®, Fortran, Perl, Pascal, Curl, OCaml, JavaScript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A RF power generator, comprising:
   a fixed power generation section including a first plurality of power amplifiers each configured to receive a supply voltage and to output a first voltage; and
   a weighted power generation section including a plurality of weighted power amplifier modules, each weighted power amplifier module including a weighted power amplifier and a transformer, wherein each weighted power amplifier of the plurality of weighted power amplifier modules receives a respective weighted supply voltage, and a voltage across the transformer of each weighted power amplifier module is a fraction of the first voltage.

2. The RF power generator of claim 1 wherein at least one of the plurality of weighted power amplifiers of the plurality of weighted power amplifier modules receives a fraction of the supply voltage and the at least one of the plurality of weighted power amplifier modules is configured to output a voltage that is a fraction of the first voltage.

3. The RF power generator of claim 2 wherein the at least one of the plurality of weighted power amplifier modules is configured to output a different fraction of the first voltage from an other of the plurality of weighted power amplifier modules.

4. The RF power generator of claim 1 wherein more than one of the plurality of weighted power amplifier modules receives a same fraction of the supply voltage.

5. The RF power generator of claim 4 wherein a transformer associated with one of the more than one of the plurality of weighted power amplifier modules has a different turns ratio than an other of the more than one of the plurality of weighted power amplifier modules.

6. The RF power generator of claim 1 wherein at least one of the plurality of weighted power amplifier modules receives the supply voltage and the at least one of the plurality of weighted power amplifier modules is configured to output a voltage that is a fraction of the first voltage.

7. The RF power generator of claim 6 wherein a transformer associated with at least one of the plurality of weighted power amplifier modules has a different turns ratio so that the at least one of the plurality of weighted power amplifier modules outputs a voltage that is a fraction of the first voltage.

8. The RF power generator of claim 1 wherein more than one of the plurality of weighted power amplifier modules receives the supply voltage and the more than one of the plurality of weighted power amplifier modules is configured to output a voltage that is a fraction of the first voltage.

9. The RF power generator of claim 8 wherein a transformer associated with more than one of the plurality of weighted power amplifier modules has a different turns ratio than an other of the more than one of the plurality of weighted power amplifier modules.

10. The RF power generator of claim 1 further comprising a DC/DC converter, the DC/DC converter configured to receive the supply voltage and to generate a weighted supply voltage, wherein the weighted supply voltage is input to a weighted power amplifier of the plurality of weighted power amplifier modules.

11. The RF power generator of claim 1 further comprising a plurality of DC/DC converters, each DC/DC converter configured to receive the supply voltage and to generate the respective weighted supply voltage, wherein each weighted supply voltage is input to a respective weighted power amplifier of the plurality of weighted power amplifier modules.

12. The RF power generator of claim 11 wherein the weighted supply voltage is a binary fraction of the supply voltage.

13. The RF power generator of claim 1 further comprising a harmonic filter configured to transform an impedance of each power amplifier to an inductive impedance.

14. The RF power generator of claim 13 wherein the inductive impedance is located above a horizontal axis of a Smith chart.

15. The RF power generator of claim 1 wherein the first plurality of power amplifiers of the fixed power generation section are connected in series.

16. The RF power generator of claim 1 wherein the each of the first plurality of power amplifiers of the fixed power generation section is configured to output the respective first voltage to a respective transformer, and the respective transformers are connected in series.

17. The RF power generator of claim 1 wherein the weighted power amplifier modules of the weighted power generation section are connected in series.

18. The RF power generator of claim 1 wherein each of the plurality of weighted power amplifier modules of the weighted power generation section is configured to output the fraction of the first voltage to respective associated transformers, and the respective associated transformers are connected in series.

19. The RF power generator of claim 1 wherein each power amplifier of the fixed power generation section and each power amplifier module of the weighted power generation section are connected in series, and the fixed power generation section and the weighted power generation section are connected in series.

20. The RF power generator of claim 1 wherein less than all of the first plurality of power amplifiers of the fixed power generation section generate a voltage output at one time, and the first plurality of power amplifiers rotate between generating an output voltage and being turned off.

21. The RF power generator of claim 1 wherein the fraction of the first voltage is a binary fraction of the first voltage.

22. A RF power generator, comprising:
   a fixed power generation section including a first plurality of power amplifiers each configured to receive a supply voltage and to output a first voltage; and
   a weighted power generation section including a plurality of weighted power amplifier modules, each weighted power amplifier module is configured to receive a respective weighted supply voltage, and a voltage across the output of each weighted power amplifier module is a fraction of the first voltage.

23. The RF power generator of claim 22 wherein at least one of the plurality of weighted power amplifiers of the plurality of weighted power amplifier modules receives a fraction of the supply voltage and the at least one of the plurality of weighted power amplifier modules is configured to output a voltage that is a fraction of the first voltage.

24. The RF power generator of claim 22 wherein at least one of the plurality of weighted power amplifier modules receives the supply voltage and the at least one of the plurality of weighted power amplifier modules is configured to output a voltage that is a fraction of the first voltage.

25. The RF power generator of claim 22 further comprising at least one DC/DC converter, the at least one DC/DC converter configured to receive the supply voltage and to generate a weighted supply voltage, wherein the weighted supply voltage is input to a weighted power amplifier of the plurality of weighted power amplifier modules.

26. The RF power generator of claim 22 wherein the weighted supply voltage is a binary fraction of the supply voltage.

27. The RF power generator of claim 22 further comprising a harmonic filter configured to transform an impedance of each power amplifier to an inductive impedance.

28. The RF power generator of claim 22 wherein the first plurality of power amplifiers of the fixed power generation section is connected in series.

29. The RF power generator of claim 22 wherein the each of the first plurality of power amplifiers of the fixed power generation section is configured to output the respective first voltage to a respective transformer, and the respective transformers are connected in series.

30. The RF power generator of claim 22 wherein the weighted power amplifier modules of the weighted power generation section are connected in series.

31. The RF power generator of claim 22 wherein each of the plurality of weighted power amplifier modules of the weighted power generation section is configured to output the fraction of the first voltage to respective transformers, and the respective associated transformers are connected in series.

32. The RF power generator of claim 22 wherein each power amplifier of the fixed power generation section and each power amplifier module of the weighted power generation section are connected in series, and the fixed power generation section and the weighted power generation section are connected in series.

33. The RF power generator of claim 22 wherein less than all of the first plurality of power amplifiers of the fixed power generation section generates a voltage output at one time, and the first plurality of power amplifiers rotate between generating an output voltage and being turned off.

\* \* \* \* \*